(12) United States Patent
Ogawa et al.

(10) Patent No.: US 11,493,844 B2
(45) Date of Patent: Nov. 8, 2022

(54) PHOTOSENSITIVE RESIN COMPOSITION FOR FLEXOGRAPHIC PRINTING PLATE, FLEXOGRAPHIC PRINTING ORIGINAL PLATE, FLEXOGRAPHIC PRINTING PLATE, AND COPOLYMER

(71) Applicant: ASAHI KASEI KABUSHIKI KAISHA, Tokyo (JP)

(72) Inventors: Hiroshi Ogawa, Tokyo (JP); Hideo Saito, Tokyo (JP); Tohru Kihara, Tokyo (JP); Kenji Ota, Tokyo (JP)

(73) Assignee: ASAHI KASEI KABUSHIKI KAISHA, Tokyo (JP)

( * ) Notice: Subject to any disclaimer, the term of this patent is extended or adjusted under 35 U.S.C. 154(b) by 409 days.

(21) Appl. No.: 16/499,474

(22) PCT Filed: Mar. 23, 2018

(86) PCT No.: PCT/JP2018/011675
§ 371 (c)(1),
(2) Date: Sep. 30, 2019

(87) PCT Pub. No.: WO2018/186208
PCT Pub. Date: Oct. 11, 2018

(65) Prior Publication Data
US 2020/0285150 A1   Sep. 10, 2020

(30) Foreign Application Priority Data

Apr. 4, 2017 (JP) .............................. JP2017-074414
Apr. 4, 2017 (JP) .............................. JP2017-074415
Apr. 4, 2017 (JP) .............................. JP2017-074417

(51) Int. Cl.
| | | |
|---|---|---|
| G03F 7/033 | (2006.01) | |
| B41F 5/24 | (2006.01) | |
| B41N 1/12 | (2006.01) | |
| C08F 236/10 | (2006.01) | |

(52) U.S. Cl.
CPC ............... *G03F 7/033* (2013.01); *B41F 5/24* (2013.01); *B41N 1/12* (2013.01); *C08F 236/10* (2013.01)

(58) Field of Classification Search
None
See application file for complete search history.

(56) References Cited

U.S. PATENT DOCUMENTS

| | | |
|---|---|---|
| 5,348,844 A | 9/1994 | Garmong |
| 5,976,763 A | 11/1999 | Roberts et al. |
| 9,366,959 B2 | 6/2016 | Tsai |
| 2004/0067442 A1 | 4/2004 | Araki et al. |
| 2005/0233249 A1 | 10/2005 | Muldermans et al. |
| 2009/0075199 A1* | 3/2009 | Lungu ...................... B41N 1/12 430/281.1 |
| 2012/0288682 A1 | 11/2012 | Inoue et al. |

FOREIGN PATENT DOCUMENTS

| | | |
|---|---|---|
| EP | 0513493 | 11/1992 |
| JP | 52-134655 | 11/1977 |
| JP | 55-25046 | 2/1980 |
| JP | H10-161301 | 6/1998 |
| JP | 2002-189288 | 7/2002 |
| JP | 2003-066605 | 3/2003 |
| JP | 2003-107681 | 4/2003 |
| JP | 2004-102187 | 4/2004 |
| JP | 2006-514338 | 4/2006 |
| JP | 2006-163284 | 6/2006 |
| JP | 3836433 | 10/2006 |
| JP | 4014381 | 11/2007 |
| JP | 4211141 | 1/2009 |
| JP | 2010-191352 | 9/2010 |
| JP | 4627871 | 2/2011 |
| JP | 2012-173368 | 9/2012 |
| JP | 2012-189848 | 10/2012 |
| JP | 5228572 | 7/2013 |
| JP | 5325823 | 10/2013 |
| JP | 5401840 | 1/2014 |
| JP | 2014-197078 | 10/2014 |
| JP | 2015-014685 | 1/2015 |
| JP | 2015-102641 | 6/2015 |
| JP | 2017-032845 | 2/2017 |
| JP | 2017032845 A * | 2/2017 |
| WO | 2002/044813 | 6/2002 |
| WO | WO-2015182384 A1 * | 12/2015 ............. G02B 5/223 |

OTHER PUBLICATIONS

International Search Report issued in International Patent Application No. PCT/JP2018/011675, dated Jun. 26, 2018, English Translation.
IPRP issued in International Patent Application No. PCT/JP2018/011675, dated Oct. 8, 2019, English Translation.
Supplementary European Search Report, European patent Office, Application No. 18781225.0, dated Mar. 25, 2020.

* cited by examiner

*Primary Examiner* — Joshua D Zimmerman
(74) *Attorney, Agent, or Firm* — Greenblum & Bernstein, P.L.C.

(57) ABSTRACT

The present invention provides a photosensitive resin composition for a flexographic printing plate, the photosensitive resin composition including at least a hydrophilic copolymer (A), a thermoplastic elastomer (B), a photo-polymerizable monomer (C), a photo-polymerization initiator (D), a plasticizer (E), and an acidic group-containing polymer (F), wherein the photosensitive resin composition for the flexographic printing plate has an acid value of 1 to 100 mgKOH/g, as measured by neutralization titration.

20 Claims, No Drawings

PHOTOSENSITIVE RESIN COMPOSITION FOR FLEXOGRAPHIC PRINTING PLATE, FLEXOGRAPHIC PRINTING ORIGINAL PLATE, FLEXOGRAPHIC PRINTING PLATE, AND COPOLYMER

TECHNICAL FIELD

The present invention relates to a photosensitive resin composition for a flexographic printing plate, a flexographic printing original plate, a flexographic printing plate, and a copolymer.

BACKGROUND ART

Flexographic printing is one kind of relief printing, and has the advantage of being applicable to various objects to be printed because flexible materials such as rubber and synthetic resins are used for printing plates.

Flexographic printing has been conventionally according to a method including making a plate by use of a negative film as a printing plate or a method using a computer plate-making technique (hereinafter, CTP technique), the method including directly drawing information processed on a computer, on a printing plate, to thereby make a relief, and the method using a CTP technique has become increasingly mainstream in recent years.

Original plates of flexographic printing plates are different between the method using a negative film and the method using a CTP technique in terms of plate configuration. While both the method using a negative film and the method using a CTP technique are common to each other in that a photosensitive layer made of a photosensitive resin composition is provided on a substrate such as a PET resin, the method using a negative film and the method using a CTP technique are different from each other in terms of an article formed on each photosensitive layer.

The method using a negative film is conducted with a transparent image carrier layer for protection of a negative film from tackiness of a photosensitive layer, and includes allowing a negative film to closely adhere to a transparent image carrier layer before use and irradiating a photosensitive layer with external radiation from above of the negative film, to remove an uncured portion, thereby forming a relief image.

On the other hand, the method using a CTP technique includes stacking an infrared ablation layer on a photosensitive layer, performing direct drawing onto the infrared ablation layer by laser or the like, and thereafter irradiating the photosensitive layer with ultraviolet light to remove an uncured portion, thereby forming a relief image.

Recently, such removal of an uncured portion has been sometimes performed by a developer containing water as a main component (development with water), resulting in formation of a relief image.

Meanwhile, a general aqueous developable flexographic printing original plate is provided with a photosensitive layer formed on a support for maintaining of dimension accuracy, the photosensitive layer being made of a photosensitive resin composition obtained by mixing of a hydrophilic copolymer, a hydrophobic resin such as an elastomer, a polymerizable unsaturated monomer, a photo-polymerization initiator, and the like.

The photosensitive resin composition for use in such a photosensitive layer preferably includes each component finely dispersed in the composition in order that a required image is faithfully obtained, and the flexographic printing original plate using the photosensitive resin composition is preferably high in development speed for a decrease in plate-making time.

Furthermore, the photosensitive resin composition is preferably low in water swelling rate after curing because it is necessary to withstand use of an aqueous ink and wash off the ink attached, with water after plate making, and the flexographic printing plate using the photosensitive resin composition is naturally demanded to be high in printing resistance.

For example, Patent Literature 1 discloses, as a water-developable photosensitive resin composition, a photosensitive resin composition containing a water dispersion latex, a photo-polymerizable monomer, millable rubber, maleic acid half ester, and a photo-polymerization initiator.

Moreover, Patent Literature 2 discloses a photosensitive resin composition further containing a hydrophilic photo-polymerizable monomer, in which a dispersion phase with a latex dispersed in the hydrophilic photo-polymerizable monomer is formed.

Furthermore, Patent Literature 3 discloses a photosensitive resin composition where a water dispersion latex is synthesized by emulsion polymerization using a reactive emulsifier containing an unsaturated double bond and is internally crosslinked.

CITATION LIST

Patent Literature

Patent Literature 1: Japanese Unexamined Patent Application Publication No. 2014-197078
Patent Literature 2: Japanese Patent No. 4211141
Patent Literature 3: Japanese Unexamined Patent Application Publication No. 2015-14685

SUMMARY OF INVENTION

Technical Problem

The aqueous developable photosensitive resin compositions described in Patent Literatures 1 and 2 have been each proposed as a resin composition having a layer separation structure configured so that a hydrophobic component is surrounded by a hydrophilic component.

While such a resin composition is used to result in an improvement in development speed, a problem is that the hydrophilic component is disposed on the outside of the hydrophobic component to result in an increase in hygroscopicity from the external. The printing plate using the resin composition has the problem of being deteriorated in printing resistance after ink attachment.

While the aqueous developable photosensitive resin composition described in Patent Literature 3 is high in printing resistance of a printing plate, such a resin has the problem of not being excellent in developability with an aqueous developer.

While the photosensitive resin composition for use in the printing original plate for flexographic printing is thus demanded to have favorable developability with an aqueous developer and printing resistance after formation into a printing plate, such properties contradict each other and are difficult to simultaneously satisfy.

Moreover, water resistance is also required because an aqueous developer is used in production of a printing plate for flexographic printing.

An object of the present invention is to provide a photosensitive resin composition that can simultaneously satisfy favorable developability with an aqueous developer, water resistance, and printing resistance after formation into a printing plate.

Solution to Problem

The present inventors have made intensive studies about a photosensitive resin composition for a flexographic printing plate, and as a result, have found that a photosensitive resin composition having a specific acid value can be enhanced in developability with an aqueous developer while having water resistance and printing resistance in formation into a printing plate, thereby leading to completion of the present invention.

That is, the present invention is as follows.

[1]

A photosensitive resin composition for a flexographic printing plate, the photosensitive resin composition comprising at least:
a hydrophilic copolymer (A);
a thermoplastic elastomer (B);
a photo-polymerizable monomer (C);
a photo-polymerization initiator (D);
a plasticizer (E); and
an acidic group-containing polymer (F);
wherein the photosensitive resin composition for the flexographic printing plate has an acid value of 1 to 100 mgKOH/g, as measured by neutralization titration.

[2]

The photosensitive resin composition for the flexographic printing plate according to [1], wherein when the photosensitive resin composition is formed into a cured product and a cross section of the cured product is observed,
C/A is 80 to 98% wherein an area of a region where the hydrophilic copolymer (A) is present is designated as A, an area of a region where an acid component is present, as observed by NanoIR, is designated as B, and an area where A and B are matched is designated as C.

[3]

The photosensitive resin composition for the flexographic printing plate according to [1] or [2], wherein the acidic group-containing polymer (F) is an acidic group-containing polymer having an acid value of 10 to 400 mgKOH/g, and the photosensitive resin composition for the flexographic printing plate comprises 1 to 50% by mass of the acidic group-containing polymer (F).

[4]

The photosensitive resin composition for the flexographic printing plate according to any of [1] to [3], wherein the acidic group-containing polymer (F) has an SP value of 9.0 or more and 16.0 or less.

[5]

The photosensitive resin composition for the flexographic printing plate according to any of [1] to [4], wherein the acidic group is at least one selected from the group consisting of a carboxyl group, a sulfonic acid group, a sulfinic acid group, a sulfuric acid group, a phosphoric acid group, a phosphonic acid group, a phosphinic acid group, and a phenol group.

[6]

The photosensitive resin composition for the flexographic printing plate according to any of [1] to [5], wherein the acidic group-containing polymer (F) is a polymer having a poly(meth)acrylic backbone having a weight average molecular weight of 1000 or more.

[7]

The photosensitive resin composition for the flexographic printing plate according to any of [1] to [6], further comprising a crosslinkable polymer (G) containing two or more radically polymerizable, ethylenically unsaturated bond groups.

[8]

The photosensitive resin composition for the flexographic printing plate according to [7], wherein the crosslinkable polymer (G) is a polymer having a number average molecular weight of 1,000 or more and less than 300,000 and having at least one selected from the group consisting of a polyisoprene backbone, a polybutadiene backbone, a hydrogenated polybutadiene backbone, and a poly(meth)acrylate backbone, and
the ethylenically unsaturated bond group is (meth)acrylate.

[9]

The photosensitive resin composition for the flexographic printing plate according to [7] or [8], wherein the crosslinkable polymer (G) has an acid value of 1 to 400 mgKOH/g.

[10]

The photosensitive resin composition for the flexographic printing plate according to any of [7] to [9], wherein a weight ratio of the hydrophilic copolymer (A) to the crosslinkable polymer (G) is 1% or more and less than 30%.

[11]

The photosensitive resin composition for the flexographic printing plate according to any of [7] to [10], wherein the crosslinkable polymer (G) has an acid structure having an acid value of 1 to 400 mgKOH/g.

[12]

The photosensitive resin composition for the flexographic printing plate according to any of [1] to [11], wherein when the photosensitive resin composition is formed into a cured product and a cross section of the cured product is observed,
a proportion of a phase having a phase area of 3 μm$^2$ or more and less than 100 μm$^2$ in a phase comprising the hydrophilic copolymer (A) is 20% by area or more.

[13]

The photosensitive resin composition for the flexographic printing plate according to any of [1] to [12], wherein
a content of the elastomer (B) is 50 parts by mass or more and 400 parts by mass or less,
a content of the photo-polymerizable monomer (C) is 10 parts by mass or more and 200 parts by mass or less,
a content of the photo-polymerization initiator (D) is 0.1 parts by mass or more and 50 parts by mass or less,
a content of the plasticizer (E) is 1.0 part by mass or more and 400 parts by mass or less, and
a content of the plasticizer (F) is 5 parts by mass or more and 800 parts by mass or less,
with respect to a total amount of a monomer unit constituting the hydrophilic copolymer (A) of 100 parts by mass.

[14]

The photosensitive resin composition for the flexographic printing plate according to any of [1] to [13], wherein the hydrophilic copolymer (A) comprises 3.0 parts by mass or more and 25 parts by mass or less of a carboxyl group-containing unsaturated monomer unit, 20 parts by mass or more and 60 parts by mass or less of a conjugated diene-based monomer unit, 10 parts by mass or more and 30 parts by mass or less of an aromatic vinyl compound unit, and 25 parts by mass or more and 45 parts by mass or less of an alkyl (meth)acrylate unit, with respect to a total amount of a monomer unit constituting the hydrophilic copolymer (A) of 100 parts by mass.

[15]

The photosensitive resin composition for the flexographic printing plate according to any of [1] to [14], wherein the hydrophilic copolymer (A) has a gel fraction of 80% or more and 99% or less, and the hydrophilic copolymer (A) has a degree of swelling in toluene, of 3.0 or more and 15 or less.

[16]

The photosensitive resin composition for the flexographic printing plate according to any of [1] to [15], wherein the hydrophilic copolymer (A) has a water absorption rate of a film, of 30% or more.

[17]

The photosensitive resin composition for the flexographic printing plate according to any of [1] to [16], wherein the hydrophilic copolymer (A) is an internally crosslinked polymer particle comprising a unit derived from an unsaturated double bond-containing reactive emulsifier.

[18]

A method for producing the photosensitive resin composition for the flexographic printing plate according to any of [1] to [17], the method comprising the following steps 1 to 3 in the listed order:

step 1; a step of adding the acidic group-containing polymer (F) and/or the crosslinkable polymer (G), and the plasticizer (E) to a water dispersion liquid comprising the hydrophilic copolymer (A), step 2; a step of removing water from the water dispersion liquid comprising the hydrophilic copolymer (A), obtained in step 1, to obtain a mixture comprising the hydrophilic copolymer (A), and step 3; a step of adding the elastomer (B), the polymerizable unsaturated monomer (C), the photo-polymerization initiator (D), and the plasticizer (E) to the mixture obtained in step 2, and kneading the resultant.

[19]

A flexographic printing original plate comprising a support, and a photosensitive resin layer stacked on the support, wherein the photosensitive resin layer comprises the photosensitive resin composition for the flexographic printing plate according to any of [1] to [17].

[20]

A flexographic printing plate produced from the flexographic printing original plate according to [19], wherein the flexographic printing plate has an amount of abrasion of 10 mg/cm² or less in an abrasion resistance test of a solid portion with a Taber abrasion tester run 1000 times after immersion in a 10% IPA solution for 24 hours, and an amount of abrasion of 20 mg or less in an abrasion resistance test of a rhombic pattern with a Taber abrasion tester run 2000 times.

[21]

A copolymer comprising a carboxyl group-containing unsaturated monomer unit, a conjugated diene-based monomer unit, an aromatic vinyl compound unit, and an alkyl (meth)acrylate unit, wherein the copolymer comprises:

3.0 parts by mass or more and 25 parts by mass or less of the carboxyl group-containing unsaturated monomer unit;

20 parts by mass or more and 60 parts by mass or less of the conjugated diene-based monomer unit;

10 parts by mass or more and 30 parts by mass or less of the aromatic vinyl compound unit; and 25 parts by mass or more and 45 parts by mass or less of the alkyl (meth)acrylate unit;

with respect to a total amount of a monomer unit comprised in the copolymer of 100 parts by mass.

[22]

The copolymer according to [21], having a gel fraction of 80% or more and 99% or less, and a degree of swelling in toluene of 3.0 or more and 15 or less.

[23]

The copolymer according to [21] or [22], having a water absorption rate of a film, of 30% or more.

[24]

A photosensitive resin composition comprising the copolymer according to any of [21] to [23].

[25]

A flexographic printing original plate comprising the copolymer according to any of [21] to [23].

Advantageous Effect of Invention

According to the present invention, there can be provided an original plate for flexographic printing high in developability with an aqueous developer while water resistance and printing resistance in formation into a printing plate are maintained.

DESCRIPTION OF EMBODIMENTS

Hereinafter, an embodiment for carrying out the present invention (hereinafter, referred to as "present embodiment".) will be described in detail, but the present invention is not intended to be limited thereto and can be variously modified without departing from the gist thereof.

A photosensitive resin composition for a flexographic printing plate of the present embodiment contains a hydrophilic copolymer (A), an elastomer (B), a polymerizable unsaturated monomer (C), a photo-polymerization initiator (D), a plasticizer (E), and an acidic group-containing polymer (F).

The photosensitive resin composition for the flexographic printing plate of the present embodiment can be suitably used for a photosensitive resin composition layer of a flexographic printing plate with an aqueous developer.

(Hydrophilic Copolymer (A))

In the present embodiment, the "hydrophilic copolymer (A)" means an internally crosslinked polymer particle containing at least a hydrophilic carboxyl group-containing unsaturated monomer, a conjugated diene-based monomer, an aromatic vinyl compound, and a unit (monomer unit) derived from alkyl (meth)acrylate.

(Carboxyl Group-Containing Unsaturated Monomer)

The carboxyl group-containing unsaturated monomer is not particularly limited, and examples thereof include a monobasic acid monomer and a dibasic acid monomer. More specifically, examples of such a monobasic acid include acrylic acid, methacrylic acid, crotonic acid, vinylbenzoic acid, and cinnamic acid, as well as a sodium salt, a potassium salt, and an ammonium salt of such a monobasic acid monomer. Examples of such a dibasic acid monomer include itaconic acid, fumaric acid, maleic acid, citraconic acid, and muconic acid, as well as a sodium salt, a potassium salt, and an ammonium salt of such a dibasic acid monomer. In the present embodiment, at least one of such carboxyl group-containing unsaturated monomers may be used, or a plurality of such carboxyl group-containing unsaturated monomers may be simultaneously used.

The content of the carboxyl group-containing unsaturated monomer is usually 1.0 part by mass or more and 30 parts by mass or less, preferably 3.0 parts by mass or more and 25 parts by mass or less, and more preferably 5.0 parts by mass or more and 20 parts by mass or less, further preferably 5.0 parts by mass or more and 15 parts by mass or less, with respect to a total amount of the monomer unit contained in the hydrophilic copolymer (A) of 100 parts by mass. A content of 3.0 parts by mass or more tends to impart favorable developability after exposure, and a content of 25 parts by mass or less tends to impart high water resistance, and small variation in position relative to a mask image in a printing plate after exposure and development.

(Conjugated Diene-Based Monomer)

The conjugated diene-based monomer is not particularly limited, and examples thereof include 1,3-butadiene, isoprene, 2,3-dimethyl1,3-butadiene, 2-ethyl-1,3-butadiene, 2-methyl-1,3-butadiene, 1,3-pentadiene, chloroprene, 2-chloro-1,3-butadiene, and cyclopentadiene. In the present embodiment, at least one of such conjugated diene-based monomers may be used, or a plurality of such conjugated diene-based monomers may be simultaneously used. In particular, butadiene is preferable in terms of availability.

With regard to monomers other than the carboxyl group-containing unsaturated monomer, namely, the conjugated diene-based monomer, the aromatic vinyl compound, and the unit derived from alkyl (meth)acrylate, and other unsaturated monomer(s) described below, the mass ratio between the conjugated diene-based monomer and other monomers (namely, all of the aromatic vinyl compound, the unit derived from alkyl (meth)acrylate, and such other unsaturated monomer(s)) is usually between 5/95 and 95/5.

The content of the conjugated diene monomer is preferably 20 parts by mass or more and 80 parts by mass or less, more preferably 20 parts by mass or more and 70 parts by mass or less, further preferably 20 parts by mass or more and 60 parts by mass or less, still further preferably 30 parts by mass or more and 60 parts by mass or less, with respect to a total amount of the monomer unit contained in the hydrophilic copolymer (A) of 100 parts by mass. A content of 80 parts by mass or less can allow a plate having favorable printing resistance to be obtained, and a content of 20 parts by mass or more can suppress reductions in water resistance and printing resistance.

(Aromatic Vinyl Compound)

The aromatic vinyl compound is not particularly limited, and examples thereof include styrene, α-methylstyrene, o-methylstyrene, m-methylstyrene, p-methylstyrene, ethylstyrene, vinylxylene, bromostyrene, vinyl benzylchloride, p-t-butylstyrene, chlorostyrene, and alkylstyrene. In the present embodiment, at least one of such aromatic vinyl compounds may be used, or a plurality of such aromatic vinyl compounds may be simultaneously used. In particular, styrene and α-methylstyrene are preferable.

The content of the aromatic vinyl compound is 10 parts by mass or more and 30 parts by mass or less, preferably 15 parts by mass or more and 30 parts by mass or less, further preferably 20 parts by mass or more and 30 parts by mass or less, with respect to the total amount (100 parts by mass) of the monomer unit contained in the hydrophilic copolymer (A). A content of 10 parts by mass or more imparts favorable printing resistance, and a content of 30 parts by mass or less can allow the photosensitive resin composition to be uniformly dispersed during mixing.

(Alkyl (Meth)Acrylate)

The "alkyl (meth)acrylate" collectively means alkyl acrylate and alkyl methacrylate. The alkyl (meth)acrylate is not particularly limited, and examples thereof include methyl (meth)acrylate, ethyl (meth)acrylate, propyl (meth)acrylate, n-butyl (meth)acrylate, isobutyl (meth)acrylate, t-butyl (meth)acrylate, n-amyl (meth)acrylate, isoamyl (meth)acrylate, octyl (meth)acrylate, 2-ethylhexyl (meth)acrylate, nonyl (meth)acrylate, decyl (meth)acrylate, dodecyl (meth)acrylate, octadecyl (meth)acrylate, cyclohexyl (meth)acrylate, phenyl (meth)acrylate, benzyl (meth)acrylate, and hydroxyethyl (meth)acrylate. In the present embodiment, at least one of such alkyl (meth)acrylates may be used, or a plurality of such alkyl (meth)acrylates may be simultaneously used. In particular, alkyl acrylates having a glass transition temperature of −30° C. or less, such as ethyl acrylate, propyl acrylate, n-butyl acrylate, isobutyl acrylate, t-butyl acrylate, n-amyl acrylate, isoamyl acrylate, 2-ethylhexyl acrylate, octyl acrylate, nonyl acrylate, and decyl acrylate are preferable.

The content of the alkyl (meth)acrylate is preferably 10 parts by mass or more and 45 parts by mass or less, more preferably 15 parts by mass or more and 45 parts by mass or less, further preferably 25 parts by mass or more and 45 parts by mass or less, with respect to the total amount (100 parts by mass) of the monomer unit contained in the hydrophilic copolymer (A). A content of 10 parts by mass or more imparts excellent printing resistance and dispersibility. The reason for this is presumed as follows: the alkyl (meth)acrylate plays a role as a glue for suppression of aggregation and breakage of a latex film, resulting in enhancements in elongation and strength of the latex film and thus contributing to an enhancement in dispersibility during kneading. A content of 45 parts by mass or less can allow the photosensitive resin composition to be uniformly dispersed during mixing.

(Other Unsaturated Monomer(s))

Any unsaturated monomer(s) (hereinafter, also referred to as "other unsaturated monomer(s)".) other than the carboxyl group-containing unsaturated monomer, the conjugated diene-based monomer, the aromatic vinyl compound, and the alkyl (meth)acrylate, which can be used in the hydrophilic copolymer (A), are/is not particularly limited, and examples thereof include a polyfunctional vinyl compound, a hydroxyl group-containing, ethylene-based monocarboxylic acid alkyl ester monomer, an unsaturated dibasic acid alkyl ester, maleic anhydride, a vinyl cyanide compound, (meth)acrylamide and a derivative thereof, vinyl esters, vinyl ethers, vinyl halides, an amino group-containing basic monomer, a vinyl-containing, nitrogen-containing heterocyclic monomer, olefin, a silicon-containing α,β-ethylenically unsaturated monomer, and an allyl compound.

Herein, the "monomer" means not only the carboxyl group-containing unsaturated monomer, the conjugated diene-based monomer, the aromatic vinyl compound, and the alkyl (meth)acrylate, but also such other unsaturated monomer(s), provided that a reactive emulsifier is excluded.

The total content of the carboxyl group-containing unsaturated monomer, the conjugated diene-based monomer, the aromatic vinyl compound, and the alkyl (meth)acrylate, and such other unsaturated monomer(s) optionally contained, constituting the hydrophilic copolymer (A), is preferably 100 parts by mass (Polyfunctional Vinyl Compound)

The "polyfunctional vinyl compound" refers to any monomer (provided that a conjugated diene monomer is excluded) having two or more vinyl bonds in one molecule, and examples thereof include an aromatic polyfunctional vinyl compound and a polyfunctional alkyl (meth)acrylate.

The aromatic polyfunctional vinyl compound is not particularly limited, and examples thereof include divinylbenzene and trivinylbenzene. The polyfunctional (meth)acrylate is not particularly limited, and examples thereof include ethylene glycol di(meth)acrylate, ethylene glycol di(meth) acrylate, 1,3-butylene glycol di(meth)acrylate, 1,4-butylene glycol di(meth)acrylate, propylene glycol di(meth)acrylate, 1,5-pentanediol di(meth)acrylate, neopentyl glycol di(meth) acrylate, 1,6-hexanediol di(meth)acrylate, diethylene glycol di(meth)acrylate, triethylene glycol di(meth)acrylate, tetraethylene glycol di(meth)acrylate, polyethylene glycol di(meth)acrylate, polypropylene glycol di(meth)acrylate, pentaerythritol tri(meth)acrylate, trimethylolpropane tri (meth)acrylate, tetramethylolmethane tetra(meth)acrylate, allyl (meth)acrylate, bis(4-acryloxypolyethoxyphenyl)propane, methoxypolyethylene glycol (meth)acrylate, β-(meth) acryloyloxyethyl hydrogen phthalate, β-(meth)acryloyloxyethyl hydrogen succinate, 3-chloro-2-hydroxypropyl (meth) acrylate, stearyl (meth)acrylate, phenoxyethyl (meth) acrylate, phenoxypolyethylene glycol (meth)acrylate, 2-hydroxy-1,3-di(meth)acryloxypropane, 2,2-bis[4-((meth) acryloxyethoxy)phenyl]propane, 2,2-bis[4-((meth)acryloxy-diethoxy)phenyl]propane, and 2,2-bis[4-((meth)acryloxy-polyethoxy)phenyl]propane. Such examples also include a hydrophilic group-containing polyfunctional vinyl compound. These may be used singly or in combinations of two or more thereof.

The content of the polyfunctional vinyl compound is preferably low in terms of printing resistance and plate wiping resistance, and is preferably 0.5 parts by mass or less with respect to the total amount (100 parts by mass) of the monomer unit contained in the hydrophilic copolymer (A).

The hydroxyl group-containing, ethylene-based monocarboxylic acid alkyl ester monomer is not particularly limited, and examples thereof include 2-hydroxyethyl acrylate, 2-hydroxyethyl methacrylate, 2-hydroxypropyl acrylate, 2-hydroxypropyl methacrylate, 1-hydroxypropyl acrylate, 1-hydroxypropyl methacrylate, and hydroxycyclohexyl (meth) acrylate.

The unsaturated dibasic acid alkyl ester is not particularly limited, and examples thereof include crotonic acid alkyl ester, itaconic acid alkyl ester, fumaric acid alkyl ester, and maleic acid alkyl ester.

The vinyl cyanide compound is not particularly limited, and examples thereof include acrylonitrile and methacrylonitrile.

The (meth)acrylamide and derivative thereof are not particularly limited, and examples thereof include (meth) acrylamide, N-methylol(meth)acrylamide, and N-alkoxy (meth)acrylamide.

The vinyl esters are not particularly limited, and examples thereof include vinyl acetate, vinyl butyrate, vinyl stearate, vinyl laurate, vinyl myristate, vinyl propionate, and vinyl versatate.

The vinyl ethers are not particularly limited, and examples thereof include methyl vinyl ether, ethyl vinyl ether, propyl vinyl ether, butyl vinyl ether, amyl vinyl ether, and hexyl vinyl ether.

The vinyl halides are not particularly limited, and examples thereof include vinyl chloride, vinyl bromide, vinyl fluoride, vinylidene chloride, and vinylidene fluoride.

The amino group-containing basic monomer is not particularly limited, and examples thereof include aminoethyl (meth)acrylate, dimethylaminoethyl (meth)acrylate, and diethylaminoethyl (meth)acrylate.

The vinyl-containing, nitrogen-containing heterocyclic monomer is not particularly limited, and examples thereof include vinylpyridine, vinylimidazole, and vinylcarbazole.

The olefin is not particularly limited, and examples thereof include ethylene.

The silicon-containing α,β-ethylenically unsaturated monomer is not particularly limited, and examples thereof include vinyltrichlorosilane and vinyltriethoxysilane.

The allyl compound is not particularly limited, and examples thereof include allyl ester and diallyl phthalate.

Examples of such other unsaturated monomer(s) described above include a monomer having three or more double bonds, such as triallyl isocyanurate. These monomers may be used singly or as a mixture of two or more kinds thereof.

The polymerization method for providing the hydrophilic copolymer (A) for use in the present embodiment is not particularly limited, and is preferably emulsion polymerization. Such emulsion polymerization is performed by previously loading predetermined amounts of water, an emulsifier, and other additive(s) into a reaction system adjusted to a temperature at which such polymerization can be made, and then adding a photo-polymerization initiator, a monomer, the emulsifier, an adjuster, and the like into a reaction system according to a batch operation or a continuous operation for polymerization. There is also generally often used a method which includes previously loading, if necessary, predetermined amounts of a seed emulsion, a photopolymerization initiator, a monomer, and other adjuster(s) into a reaction system. It is also possible to make a design, for example, separately change the rates of addition of an unsaturated monomer, an emulsifier, other additive(s) and adjuster(s) into a reaction system, resulting in a stepwise change in the layer structure of a particle of a hydrophilic copolymer to be obtained by polymerization. Examples of representative physical properties of each layer structure include hydrophilicity, glass transition point, molecular weight, and crosslinking density. The number of steps in such a layer structure is not particularly limited.

The hydrophilic copolymer (A) preferably contains 3.0 parts by mass or more and 25 parts by mass or less of a carboxyl group-containing unsaturated monomer unit, 20 parts by mass or more and 60 parts by mass or less of a conjugated diene-based monomer unit, 10 parts by mass or more and 30 parts by mass or less of an aromatic vinyl compound unit, and 25 parts by mass or more and 45 parts by mass or less of an alkyl (meth)acrylate unit, with respect to a total amount of the monomer unit constituting the hydrophilic copolymer (A) of 100 parts by mass.

(Emulsifier)

The emulsifier (surfactant) for use in emulsion polymerization is preferably a reactive emulsifier in terms of water resistance and printing resistance.

The reactive emulsifier is preferably an unsaturated double bond-containing reactive emulsifier. The unsaturated double bond can be subjected to radical polymerization. In the case of use of such an unsaturated double bond-containing reactive emulsifier in emulsion polymerization, the hydrophilic copolymer (A) in the present embodiment is an internally crosslinked polymer particle including a unit derived from the unsaturated double bond-containing reactive emulsifier.

The reactive emulsifier which can be used in the present embodiment is more preferably an emulsifier (surfactant) which has a radical polymerizable double bond, a hydrophilic functional group, and a hydrophobic group in a molecular structure and which also has emulsification, dispersing, and wetting functions as in a common emulsifier, and which can allow a polymerized product having a particle size of 5 to 500 nm to be synthesized by singly using such an emulsifier (surfactant) in an amount of 0.1 parts by mass or more with respect to 100 parts by mass of an unsaturated monomer from which the reactive emulsifier is excluded, in formation of the hydrophilic copolymer by emulsion polymerization. Examples of the structure of the radical polymerizable double bond in the molecular structure include a vinyl group, an acryloyl group, or a methacryloyl group. Examples of the hydrophilic functional group in the molecular structure include an anionic group such as a sulfuric acid group, a nitric acid group, a phosphoric acid group, or a boric acid group, a cationic group such as a carboxyl group or an amino group, a polyoxyalkylene chain structure of polyoxyethylene, polyoxymethylene, or polyoxypropylene, or a hydroxyl group. Examples of the hydrophobic group in the molecular structure include an alkyl group and a phenyl group. The reactive emulsifier includes an anionic emulsifier, a nonionic emulsifier, a cationic emulsifier, an amphoteric emulsifier, or the like depending on the type of the structure of the hydrophilic functional group contained in the structure. The radical polymerizable double bond, the hydrophilic functional group, and the hydrophobic group in the molecular structure can also have a plurality of kinds of structures and/or functional groups.

Among those which can be used in the reactive emulsifier in the present embodiment, examples of generally commercially available products include anionic surfactants such as ADEKA REASOAP SE (Adeka Corporation), AQUARON HS, BC, and KH (DKS Co., Ltd.), LATEMUL S (Kao Corporation), Antox MS (Nippon Nyukazai Co., Ltd.), ADEKA REASOAP SDX and PP (Adeka Corporation), HITENOL A (DKS Co., Ltd.), ELEMINOL RS (Sanyo Chemical Industries, Ltd.), and SPINOMAR (Tosoh Corporation), and nonionic surfactants such as AQUARON RN and Noigen N (DKS Co., Ltd.), and ADEKA REASOAP NE (Adeka Corporation). These may be used singly or in combinations of two or more.

In the present embodiment, the amount of the reactive emulsifier to be used is preferably 1 part by mass or more and 20 parts by mass or less with respect to the total amount (100 parts by mass) of the monomer unit contained in the hydrophilic copolymer (A). An amount of the reactive emulsifier to be used, of 1 part by mass or more, tends to result in an enhancement in image reproductivity of the resulting printing plate, and an amount of 20 parts by mass or less tends to result in an enhancement in printing resistance of the resulting printing plate.

(Non-Reactive Emulsifier)

In the present embodiment, when the hydrophilic copolymer (A) is synthesized by emulsion polymerization, a non-reactive emulsifier can also be, if necessary, used. The non-reactive emulsifier here, if necessary, used is not particularly limited, and examples thereof include anionic surfactants such as fatty acid soap, rosin acid soap, sulfonate, sulfate, phosphate, polyphosphate, and acyl sarcosinate; cationic surfactants such as derivatives of nitrilized oils and fats, derivatives of oils and fats, fatty acid derivatives, and α-olefin derivatives; and nonionic surfactants such as alcohol ethoxylate, alkylphenol ethoxylate, propoxylate, aliphatic alkanol amide, alkyl polyglycoside, polyoxyethylene sorbitan fatty acid ester, and an oxyethylene-oxypropylene block copolymer. These may be used singly or in combinations of two or more.

In particular, sulfonate is preferable, and such sulfonate is not particularly limited, and examples thereof include alkyl sulfonate, alkyl sulfate, alkyl sulfosuccinate, polyoxyethylene alkyl sulfate, sulfonated oils and fats, alkyl diphenyl ether disulfonate, α-olefin sulfonate, alkyl glyceryl ether sulfonate, and N-acyl methyl taurine.

Examples of such a non-reactive emulsifier (surfactant), other than those described above, include those described in "Handbook of Surfactants (Takahashi, Nanba, Koike, and Kobayashi: Kougaku Tosho, 1972)".

The amount of the non-reactive emulsifier to be used is preferably less than 1 part by mass with respect to the total amount (100 parts by mass) of the monomer for use in formation of the hydrophilic copolymer (A) by polymerization. An amount of less than 1 part by mass tends to enable the resulting printing plate to exhibit a proper water swelling rate, resulting in suppression of deterioration in abrasion resistance in ink attachment and deterioration in image reproductivity after absorption of moisture, (Chain Transfer Agent)

In the present embodiment, a known chain transfer agent can be used for formation of the hydrophilic copolymer (A) by polymerization. The chain transfer agent is not particularly limited, and examples of a sulfur element-containing chain transfer agent include alkanethiols such as t-dodecylmercaptan and n-dodecylmercaptan; thioalkyl alcohols such as mercaptoethanol and mercaptopropanol; thioalkylcarboxylic acids such as thioglycolic acid and thiopropionic acid; thiocarboxylic acid alkyl esters such as thioglycolic acid octyl ester and thiopropionic acid octyl ester; and sulfides such as dimethyl sulfide and diethyl sulfide. Other examples of the chain transfer agent include halogenated hydrocarbons such as terpinolene, dipentene, t-terpinene, and carbon tetrachloride. In particular, alkanethiol is preferable because a high chain transfer rate is exhibited and physical properties of the resulting polymerized product are well balanced.

These chain transfer agents may be used singly or as a mixture of two or more kinds thereof. Such a chain transfer agent is mixed with the monomers and then fed to a reaction system, or is added singly in a predetermined amount at a predetermined point of time. The amount of such a chain transfer agent to be used is preferably 0.1 parts by mass or more and 10 parts by mass or less with respect to the total amount (100 parts by mass) of the monomer for use in formation of the hydrophilic copolymer (A) by polymerization. An amount of 0.1 parts by mass or more tends to allow for suppression of deterioration in processability in mixing of the photosensitive resin composition, and an amount of 10 parts by mass or less tends to allow for suppression of a remarkable decrease in molecular weight.

(Polymerization Reaction Inhibitor)

In the present embodiment, a polymerization reaction inhibitor can be, if necessary, used for formation of the hydrophilic copolymer (A) by polymerization. The "polymerization reaction inhibitor" means a compound to be added to an emulsion polymerization system for a decrease in radical polymerization rate. More specifically, such a polymerization reaction inhibitor corresponds to any of a polymerization rate retarder, a polymerization inhibitor, a chain transfer agent low in radical re-initiation reactivity, and a monomer low in radical re-initiation reactivity. The polymerization reaction inhibitor is generally used for adjustment of the polymerization reaction rate and adjustment of physical properties of an emulsion-polymerized product. Such a polymerization reaction inhibitor is added to a reaction system by a batch operation or a continuous operation. Use of the polymerization reaction inhibitor allows for an enhancement in strength of a copolymer film and an enhancement in printing resistance. While the detail of a reaction mechanism is not clear, the polymerization reaction inhibitor is considered to be closely associated with the steric structure of a polymer, and thus is presumed to have any effect on adjustment of physical properties of a copolymer film.

The polymerization reaction inhibitor is not particularly limited, and examples thereof include quinones such as o-, m-, or p-benzoquinone; a nitro compound such as nitrobenzene, or o-, m-, or p-dinitrobenzene; amines such as diphenylamine; a catecol derivative such as tert-butylcatecol; a 1,1-disubstituted vinyl compound such as 1,1-diphenylethylene, α-methylstyrene, or 2,4-diphenyl-4-methyl-1-pentene; and a 1,2-disubstituted vinyl compound such as 2,4-diphenyl-4-methyl-2-pentene and cyclohexene. Other examples include compounds as polymerization inhibitors or polymerization suppressors described in "POLYMER HANDBOOK 3rd Ed. (J. Brandup, E. H. Immergut: John Wiley & Sons, 1989)" and "Polymer Synthesis Chemistry (revised) (Kaitei Kobunshi Gosei No Kagaku) (Otsu: Kagaku-Dojin Publishing Company, INC., 1979.)" In particular, 2,4-diphenyl-4-methyl-1-pentene (α-methylstyrene dimer) is preferable in terms of reactivity. These polymerization reaction inhibitors may be used singly or as a mixture of two or more kinds thereof.

The amount of such a polymerization reaction inhibitor to be used is preferably 10 parts by mass or less with respect to the total amount (100 parts by mass) of the monomer for use in formation of the hydrophilic copolymer (A) by polymerization. An amount of 10 parts by mass or less tends to allow for suppression of a remarkable decrease in polymerization rate.

(Radical Polymerization Initiator)

The radical polymerization initiator means one which is to be radically decomposed in the presence of heat or a reducing substance to thereby initiate addition polymerization of the monomers, and any of an inorganic initiator and an organic initiator can be used therefor. Such a radical polymerization initiator is not particularly limited, and examples thereof include water-soluble or oil-soluble peroxodisulfate, peroxide, and an azobis compound, specific examples thereof include potassium peroxodisulfate, sodium peroxodisulfate, ammonium peroxodisulfate, hydrogen peroxide, t-butylhydroperoxide, benzoyl peroxide, 2,2-azobisbutyronitrile, and cumene hydroperoxide, and other examples include compounds described in POLYMER HANDBOOK (3rd edition), written by J. Brandrup and E. H. Immergut, John Willy & Sons (1989).

In the present embodiment, a so-called redox polymerization method can also be adopted where a reducing agent such as acidic sodium sulfite, ascorbic acid or a salt thereof, erythorbic acid or a salt thereof, or rongalite is used in combination with the polymerization initiator. In particular, peroxodisulfate is suitable as the polymerization initiator. The amount of the polymerization initiator to be used is preferably 0.1 parts by mass or more and 5.0 parts by mass or less, more preferably 0.2 parts by mass or more and 3.0 parts by mass or less, with respect to the total amount (100 parts by mass) of the monomer for use in formation of the hydrophilic copolymer (A) by polymerization. An amount of 0.1 parts by mass or more tends to impart stability in synthesis of the hydrophilic copolymer, and an amount of 5.0 parts by mass or less tends to allow for suppression of an increase in the amount of moisture absorbed by the photosensitive resin composition.

In the present embodiment, various polymerization adjusters may be, if necessary, added in synthesis of the hydrophilic copolymer (A), For example, any pH adjuster such as sodium hydroxide, potassium hydroxide, ammonium hydroxide, sodium hydrogen carbonate, sodium carbonate, or disodium hydrogen phosphate can be added as a pH adjuster. Various chelating agents such as disodium ethylenediamine tetraacetate can also be added as a polymerization adjuster. Other additives which may be added include various additives, for example, an alkali sensitive emulsion, a viscosity-reducing agent such as hexametaphosphoric acid, a water-soluble polymer such as polyvinyl alcohol or carboxymethyl cellulose, a thickener, various antioxidants, an ultraviolet absorber, an antiseptic agent, a bactericidal agent, a defoamer, a disperser such as sodium polyacrylate, a water resistant agent, a metal oxide such as zinc flower, a crosslinking agent such as an isocyanate-based compound or an epoxy compound, a lubricant, and a water retention agent. The method for adding such an additive is not particularly limited, and the addition can be made either during or after synthesis of the hydrophilic copolymer.

In the present embodiment, the polymerization temperature in formation of the hydrophilic copolymer (A) by emulsion polymerization is usually selected from the range from 60 to 120° C., and such polymerization may also be performed at a lower temperature in the case of a redox polymerization method or the like. Furthermore, for example, a divalent iron ion, a trivalent iron ion, or a copper ion may coexist as an oxidation-reduction catalyst.

The hydrophilic copolymer (A) is preferably in the form of a particle, and preferably has an average particle size of 500 nm or less, more preferably 100 nm or less. An average particle size of 500 nm or less tends to allow for suppression of a decrease in the depth of a white space of the resulting printing original plate.

(Gel Fraction)

The gel fraction of the hydrophilic copolymer (A) is preferably 80% or more and 99% or less, more preferably 85% or more and 99% or less, further preferably 90% or more and 99% or less. A gel fraction ranging of 80% or more and 99% or less tends to allow printing resistance in printing to be favorable.

(Degree of Swelling in Toluene)

The degree of swelling in toluene of the hydrophilic copolymer (A) is preferably 3.0 or more and 15 or less, more preferably 3.5 or more and 14 or less, further preferably 3.5 or more and 13 or less. A degree of swelling in toluene of 3.5 or more tends to allow favorable printing resistance to be obtained, and a degree of swelling in toluene of 15 or less tends to allow favorable developability after exposure to be obtained.

The gel fraction and the degree of swelling in toluene are measured by the following method. A dispersion liquid of the hydrophilic copolymer (A) after emulsion polymerization is dried at 130° C. for 30 minutes to provide a film, 0.5 g of the film is taken and immersed in 30 mL of toluene at 25° C., shaken with a shaker for 3 hours, and thereafter filtered by a 320 SUS mesh, thereby measuring the mass X (g) of a non-passing fraction. The non-passing fraction is dried at 130° C. for 1 hour, and thereafter the mass Y (g) is measured. The gel fraction and the degree of swelling in toluene are calculated according to the following expressions.

$$\text{Gel fraction (\%)} = Y(g)/0.5(g) \times 100$$

$$\text{Degree of Swelling in Toluene} = X(g)/Y(g)$$

(Water Absorption Rate of Film)

The water absorption rate of a film of the hydrophilic copolymer (A) is preferably 30% or more, more preferably 40% or more, further preferably 50% or more. A water absorption rate of the film, of 30% or more, tends to allow favorable developability in exposure to be obtained.

The water absorption rate of the film is here measured according to the following method. A water dispersion liquid of the hydrophilic copolymer (A) is dried at 23° C. and at a humidity of 60% for 3 days to prepare a dry film having a thickness of 0.5 µm. The film is further heated at 90° C. for 30 minutes and thus completely dried, thereafter the film is cut out to a size of 5×5 cm, and the mass V (g) of the film cut is measured. The film is immersed in water at 23° C., and the mass W (g) thereof is measured after 2 hours. The water absorption rate of the film is calculated according to the following expression.

$$\text{Water absorption rate of film (\%)} = (W-V)\,(g)/V\,(g) \times 100$$

(Thermoplastic Elastomer (B))

The thermoplastic elastomer (B) in the present embodiment means an elastomer exhibiting rubber elasticity at ordinary temperature (25° C.), and examples thereof include a thermoplastic block copolymer, polybutadiene, polyacrylonitrile-butadiene, and a polyurethane-based elastomer. In particular, a thermoplastic block copolymer is preferable. Herein, the thermoplastic elastomer (B) is also simply referred to as "elastomer (B)".

The thermoplastic block copolymer is preferably obtained by polymerization of a monovinyl-substituted aromatic hydrocarbon monomer and a conjugated diene monomer.

Examples of the monovinyl-substituted aromatic hydrocarbon monomer include styrene, α-methylstyrene, p-methylstyrene, and p-methoxystyrene. Examples of the conjugated diene monomer include butadiene and isoprene.

Specific examples of the thermoplastic block copolymer include a styrene-butadiene-styrene block copolymer (for example, D-KX405 (manufactured by Kraton Corporation)) and a styrene-isoprene-styrene copolymer. A diblock copolymer such as a styrene-butadiene copolymer or a styrene-isoprene copolymer may also be incorporated into such a styrene-butadiene-styrene block copolymer or styrene-isoprene-styrene copolymer, respectively. Alternatively, styrene and butadiene or isoprene may be randomly copolymerized in a butadiene moiety or an isoprene moiety in such a styrene-butadiene-styrene block copolymer or styrene-isoprene-styrene copolymer.

The content of a monovinyl-substituted aromatic hydrocarbon unit in the elastomer (B) is so low that cold flow of the photosensitive resin composition is caused to thereby impart no favorable thickness accuracy, and is so high that hardness of a flexographic printing plate is excessively high to impart no favorable printing quality. Thus, the content is preferably in the range from 8 to 50% by mass.

A vinyl bond unit in a conjugated diene segment of the elastomer (B) contributes to an enhancement in reproducibility of a relief, but concurrently causes an increase in tackiness of the surface of a flexographic printing plate. The average rate of the vinyl bond unit is preferably 5 to 40% by mass, more preferably 10 to 35% by mass from the viewpoint that such both properties are balanced.

The average contents of the monovinyl-substituted aromatic hydrocarbon unit and the conjugated diene unit, and the average rate of the vinyl bond unit in the conjugated diene segment of the elastomer (B) can be determined by IR spectrum and NMR.

The content of the elastomer (B) is preferably 50 parts by mass or more and 400 parts by mass or less, more preferably 50 parts by mass or more and less than 300 parts by mass, further preferably 50 parts by mass or more and 200 parts by mass or less, with respect to a total amount of the monomer unit contained in the hydrophilic copolymer (A) of 100 parts by mass.

A content of the elastomer (B), of less than 50 parts by mass, tends to cause deterioration in printing resistance and an increase in the rate of swelling of a polar ink. A content of the elastomer (B), of more than 400 parts by mass, tends to cause deterioration in developability with an aqueous developer.

The ratio of the elastomer (B) in terms of part(s) by mass to the hydrophilic copolymer (A) in terms of part(s) by mass (elastomer (B) in terms of part(s) by mass/hydrophilic copolymer (A) in terms of part(s) by mass) is preferably 1 or less, more preferably 0.9 or less, further preferably 0.8 or less.

(Polymerizable Unsaturated Monomer (C))

Examples of the polymerizable unsaturated monomer (C) in the present embodiment include ester compounds of carboxylic acids such as acrylic acid, methacrylic acid, fumaric acid, and maleic acid; derivatives of acrylamide and methacrylamide; allyl ester; styrene and a derivative thereof; and an N-substituted maleimide compound.

Specific examples of the polymerizable unsaturated monomer (C) can include alkanediol diacrylates and dimethacrylates, such as 1,9-nonanediol diacrylate and 1,6-hexanediol dimethacrylate, diacrylates and dimethacrylates of ethylene glycol, diethylene glycol, propylene glycol, dipropylene glycol, polyethylene glycol, and butylene glycol, trimethylolpropane triacrylate and trimethacrylate, pentaerythrit tetraacrylate and tetramethacrylate, N,N'-hexamethylenebisacrylamide and methacrylamide, styrene, vinyl toluene, divinylbenzene, diacrylphthalate, triallyl cyanurate, fumaric acid diethyl ester, fumaric acid dibutyl ester, fumaric acid dioctyl ester, fumaric acid distearyl ester, fumaric acid butyloctyl ester, fumaric acid diphenyl ester, fumaric acid dibenzyl ester, maleic acid dibutyl ester, maleic acid dioctyl ester, fumaric acid bis(3-phenylpropyl)ester, fumaric acid dilauryl ester, fumaric acid dibehenyl ester, and N-laurylmaleimide.

These may be used singly or in combinations of two or more kinds thereof.

The content of the polymerizable unsaturated monomer (C) is preferably 10 parts by mass or more and 200 parts by mass or less, more preferably 20 parts by mass or more and less than 150 parts by mass, further preferably 30 parts by mass or more and less than 100 parts by mass, with respect to a total amount of the monomer unit contained in the hydrophilic copolymer (A) of 100 parts by mass. A content of the polymerizable unsaturated monomer (C), of less than 10 parts by mass, tends to cause formability of fine points and characters to be deteriorated. A content of the polymerizable unsaturated monomer (C), of more than 200 parts by mass, tends to cause an uncured plate to be considerably decomposed in storage and transportation, and/or cause the resulting plate to be increased in hardness, resulting in an adverse effect, for example, loss of ink deposition on a solid region in printing on a printing object poor in paper quality due to surface irregularities.

Photo-Polymerization Initiator (D)

Examples of the photo-polymerization initiator (0) in the present embodiment can include benzophenone, Michlers ketone, benzoin, benzoinmethyl ether, benzoinethyl ether, benzoin isopropyl ether, benzoin isobutyl ether, α-methylolbenzoin, α-methylolbenzoinmethyl ether, α-methoxybenzoinmethyl ether, benzoin phenyl ether, α-t-butylbenzoin, 2,2-dimethoxyphenylacetophenone, 2,2-diethoxyphenylacetophenone, benzyl, pivaloin, anthraquinone, benzanthraquinone, 2-ethylanthraquinone, and 2-chloroanthraquinone.

These may be used singly or in combinations of two or more kinds thereof.

The content of the photo-polymerization initiator (D) is preferably 0.1 parts by mass or more and 50 parts by mass or less, more preferably 1 part by mass or more and less than 30 parts by mass, further preferably 2 parts by mass or more and less than 20 parts by mass, with respect to a total amount of the monomer unit contained in the hydrophilic copolymer (A) of 100 parts by mass. A content of the photo-polymerization initiator (D), of less than 0.1 parts by mass, tends to cause formability of fine points and characters to be deteriorated. A content of the photo-polymerization initiator (D), of 50 parts by mass or more, tends to cause the photosensitive resin composition to be reduced in transmittance of active light such as ultraviolet light, rather than resulting in the occurrence of an adverse effect of deterioration in exposure sensitivity.

Plasticizer (E)

The plasticizer (E) for use in the present embodiment is not particularly limited, and examples thereof include hydrocarbon oils such as naphthenic oil and paraffin oil; liquid conjugated diene rubber mainly containing diene, such as a liquid acrylonitrile-butadiene copolymer and a liquid styrene-butadiene copolymer; polystyrene, sebacate, and phthalate each having a number average molecular weight of 2,000 or less; and a hydrophilic copolymer.

In particular, one having a viscosity at 30° C. of 2000 Pa·s or less, namely, liquid conjugated diene rubber mainly containing diene is preferable from the viewpoint of high flexibility and high image reproductivity of a printing plate. The viscosity can be measured according to JIS-K-7117.

Such diene is preferably isoprene and/or butadiene, more preferably butadiene because these are easily available. Such conjugated diene rubber may be used in combination of two or more kinds thereof.

The content of the vinyl group in the total amount of diene contained in the conjugated diene rubber is preferably 40% by mol or more, more preferably 60% by mol or more, further preferably 80% by mol or more because reproducibility in plate making can be increased. The vinyl content in the conjugated diene rubber can be determined by $^1$H-NMR (nuclear magnetic resonance spectrum).

The number average molecular weight (Mn) of the conjugated diene rubber is not particularly limited, and is preferably 1000 or more and 50,000 or less, more preferably 1000 or more and 30000 or less, further preferably 1000 or more and 20000 or less.

The number average molecular weight (Mn) in the present embodiment means the molecular weight in terms of polystyrene, measured by gel permeation chromatography (GPC).

The conjugated diene rubber which can be used is suitably, for example, a butadiene homopolymer commercially available from Nippon Soda Co., Ltd. or Kuraray Co., Ltd.

The content of the plasticizer (E) is preferably 1.0 part by mass or more and 400 parts by mass or less with respect to a total amount of the monomer unit contained in the hydrophilic copolymer (A) of 100 parts by mass. The content of the plasticizer is more preferably 30 parts by mass or more and 380 parts by mass or less, further preferably 50 parts by mass or more and 350 parts by mass or less. A content of 1 part by mass or more tends to enable the development time to be shortened, and a content of 400 parts by mass or less tends to allow the resin layer to be pushed and to hardly flow, by loading in stacking after production of a flexographic printing original plate.

(Acidic Group-Containing Polymer (F))

The acidic group-containing polymer (F) for use in the present embodiment is preferably such a polymer having an acid value of 10 to 400 mgKOH/g.

Examples of the structure of the acidic group include a carboxyl group, a sulfonic acid group, a sulfinic acid group, a sulfuric acid group, a phosphoric acid group, a phosphonic acid group, a phosphinic acid group, and a phenol group. Among these groups, a carboxyl group is preferable. The percentage of a neutralized salt produced in neutralization with an alkali metal, NH$_3$, or the like, in the structure of the acidic group, is preferably 30% or less, more preferably 20% or less, further preferably 10% or less. A percentage of the neutralized salt, of 30% or less, tends to enable water resistance to be kept high.

The acid value of the acidic group-containing polymer (F) is preferably 10 to 400 mgKOH/g, more preferably 30 to 150 mgKOH/g, further preferably 50 to 10 mgKOH/g. An acid value of 10 mgKOH/g or more tends to allow for an enhancement in dispersibility of the photosensitive resin composition for the flexographic printing plate in water and to impart excellent developability. An acid value of 400 mgKOH/g or less tends to allow for not only suppression of hydrophilicity of the photosensitive resin composition for the flexographic printing plate, but also an enhancement in water resistance.

The acidic group-containing polymer (F) is not particularly limited, and examples thereof include respective polymers having a polyisoprene backbone, a polybutadiene backbone, a polyvinyl backbone, and a polyacrylate backbone. In particular, a polymer having a polyacrylate backbone is preferable.

The acidic group-containing polymer (F) which can be used is a resin obtained by copolymerization of a vinyl monomer having an acidic group, such as acrylic acid, methacrylic acid, 2-methacryloyloxyethyl acid phosphate, or aromatic sulfonic acid, with a vinyl monomer having no acidic group.

The vinyl monomer having no acidic group, which can be used, is, for example, an aromatic monovinyl compound such as styrene, α-methylstyrene, fluorostyrene, and vinylpyridine, a (meth)acrylate monomer such as methyl (meth)acrylate, ethyl (meth)acrylate, butyl (meth)acrylate, 2-ethylhexyl (meth)acrylate, 2-hydroxyethyl (meth)acrylate, glycidyl (meth)acrylate, or N,N-dimethylaminoethyl (meth) acrylate, or a vinyl cyanide compound such as (meth) acrylonitrile. A conjugated double bond compound such as butadiene or isoprene, any vinyl ester such as vinyl acetate, or any α-olefin such as 4-methyl-1-pentene can also be used as such a non-acidic vinyl monomer in an acceptable range from the viewpoint of the polymerization rate, stability in polymerization, and the like. Such vinyl monomers having no acidic group may be used singly or in combinations of two or more kinds thereof.

Furthermore, the acidic group-containing polymer (F) may contain other repeating unit such as an acidic group derived from acrylonitrile.

The acidic group-containing polymer (F) has a repeating unit derived from a conjugated diene compound, and preferably has a polymer having an acidic group in at least one kind of repeating unit.

Specific examples of the conjugated diene compound include butadiene and isoprene.

The acidic group in the polymer may be contained in the repeating unit derived from the conjugated diene compound, or in a repeating unit different from such a repeating unit. That is, the polymer may be produced by, for example, polymerizing a conjugated diene compound and modifying the resulting polymer by an acid, or copolymerizing a monomer having an acidic group with a conjugated diene compound. Specific examples of the monomer having an acidic group include acrylic acid, methacrylic acid, maleic acid, itaconic acid, phthalic acid, vinylsulfonic acid, 2-methacryloyloxyethyl acid phosphate, and aromatic sulfonic acid.

Furthermore, the polymer may contain other repeating unit such as a unit derived from acrylonitrile as long as the polymer has a repeating unit derived from conjugated diene and a carboxyl group in at least one kind of repeating unit.

The acid structure in the acidic group-containing polymer (F) preferably corresponds to a carboxyl group, a sulfone group, a phosphate group, or the like, and the polymer more preferably corresponds to a polymer having a carboxy group. The acidic group-containing polymer (F) may be formed from one kind of acidic group, or may be formed from two or more kinds of acidic groups or a mixture of a plurality of polymers each having an acidic group.

The acidic group-containing polymer (F) is preferably a polymer having a poly(meth)acrylic backbone having a weight average molecular weight of 1000 or more.

The polymer having a repeating unit derived from conjugated diene and a carboxyl group in at least one kind of repeating unit is preferably a copolymerized product of a conjugated diene compound and an unsaturated monocarboxylic acid (derivative), and, in particular, preferably a copolymerized product of (meth)acrylic acid and/or (meth)acrylate, butadiene and/or isoprene, and acrylonitrile. Such copolymers may have either a random structure or a block structure. The polymer is more preferably a terpolymer of (meth)acrylic acid, butadiene, and acrylonitrile.

The backbone of the acidic group-containing polymer (F) can be identified by subjecting the photosensitive resin composition for the flexographic printing plate to IR measurement.

The acidic group-containing polymer (F) is preferably contained in a content of 1 to 50% by mass in a photosensitive resin composition for a flexographic printing plate from the viewpoint of developability. The content of the plasticizer (F) is more preferably 5 to 40% by mass from the viewpoint of transmittance before curing, and further preferably 15 to 35% by mass, still further preferably 22 to 30% by mass from the viewpoint of resin moldability.

The viscosity at 60° C. of the acidic group-containing polymer (F) is preferably less than 5000 P, more preferably less than 3000 P. A viscosity at 60° C. of less than 5000 P allows a plasticization effect to be increased.

The photosensitive resin composition for the flexographic printing plate of the present embodiment, which includes a polymer having a polyacrylate backbone and having a carboxyl group in at least one kind of repeating unit (hereinafter, also referred to as "carboxylic acid-modified acrylic polymer".) as the acidic group-containing polymer (F), is observed to have more favorable developability (developability with an aqueous developer).

The photosensitive resin composition for the flexographic printing plate of the present embodiment has a sea-island structure mainly configured from a phase including the hydrophilic copolymer (A) and a phase including the elastomer (B), and it is considered that development is started with the phase including the hydrophilic copolymer (A) as a starting point. It is presumed that the carboxylic acid-modified acrylic polymer can be included in the composition, thereby allowing the hydrophilic copolymer (A) to be easily dispersed, to result in an enhancement in the degree of hydrophilicity of the phase including the hydrophilic copolymer (A) in the resin composition and thus an enhancement in developability. The present embodiment, however, is not limited by such a presumption.

Any commercially available product can be used in the acidic group-containing polymer (F), and examples of such any commercially available product include liquid carboxylic acid-modified acrylic polymers [Z250 manufactured by Daicel-Allnex Ltd.] [CB-3060, CB-3098, and CBB-3060 manufactured by Soken Chemical & Engineering Co., Ltd.], [BR-605 manufactured by Mitsubishi Rayon Co., Ltd.], [Arufon UC-3000, UC-3510 manufactured by Toagosei Co., Ltd.], and [LIR-410 manufactured by Kuraray Co., Ltd.].

The acidic group-containing hydrophilic polymer (F) can also be prepared by synthesis, and can be prepared with reference to, for example, Toagosei Annual Report of Research, "TREND", 1999, vol. 2, pages 20 to 26. Specifically, the acidic group-containing polymer (F) can be synthesized by reacting acrylic acid, a polymerization initiator such as sodium persulfate, and a chain transfer agent such as isopropyl alcohol. The acid value can be controlled by appropriately adjusting the reaction temperature, and the amounts of the polymerization initiator and the chain transfer agent added.

The content of the acidic group-containing polymer (F) is preferably 5 parts by mass or more and 800 parts by mass or less, more preferably 20 parts by mass or more and 500 parts by mass or less, further preferably 50 parts by mass or more and 300 parts by mass or less, with respect to a total amount of the monomer unit contained in the hydrophilic copolymer (A) of 100 parts by mass.

The SP value in the acidic group-containing polymer (F) is preferably 9.0 or more and 16.0 or less, more preferably 9.1 to 13, further preferably 9.3 to 11.5.

An SP value of 9.0 or more tends to enable the development time to be shortened. An SP value of 16.0 or less tends to allow for an enhancement in transparency.

The SP value means a solubility parameter, and can be calculated by subjecting each functional group constituting the molecule of the polymer to a molecular attraction constant method.

The SP value can be adjusted by the amount of a functional group (carboxylic acid) in the polymer.

<Crosslinkable Polymer (G)>

The crosslinkable polymer (G) in the present embodiment is to be polymerized and crosslinked by light irradiation to thereby serve to form a dense network for allowing a printing original plate to have a maintained shape and to keep physical properties. The crosslinkable polymer (G) in the present embodiment contains two or more radically polymerizable, ethylenically unsaturated bond groups.

The crosslinkable polymer (G) for use in the present embodiment is preferably a photo-polymerizable oligomer. Such a crosslinkable polymer being a photo-polymerizable oligomer is compatible with both the hydrophilic copolymer (A) and the elastomer (B), and is to be formed into a densely crosslinked state (network), resulting in an enhancement in printing resistance.

The crosslinkable polymer (G) in the present embodiment is preferably a photo-polymerizable oligomer where an ethylenically unsaturated group is bound to a terminal and/or a side chain of a conjugated diene-based polymer and an acrylic polymer having the same backbone structure as in the component (A).

The crosslinkable polymer (G) has the same backbone structure as in the component (A) and thus is enhanced in compatibility to result in an enhancement in rebound resilience or the like.

The crosslinkable polymer (G) is preferably, for example, a polymer having at least one selected from the group consisting of a polyisoprene backbone, a polybutadiene backbone, a hydrogenated polybutadiene backbone, and a poly(meth)acrylate backbone.

When the crosslinkable polymer (G) is a polymer having at least one selected from the group consisting of a polyisoprene backbone, a polybutadiene backbone, and a hydrogenated polybutadiene backbone, the number average molecular weight of the crosslinkable polymer (G) is preferably 1,000 or more and less than 300,000, more preferably 2,000 to 200,000, further preferably 3,000 to 150,000. A number average molecular weight of the crosslinkable polymer (E), of less than 1,000, is not preferable because compatibility with the component (A) is excessive to cause high hardness. On the other hand, a number average molecular weight of 300,000 or more causes a crosslinked state (network) not to be dense, resulting in inferior printing resistance.

When the crosslinkable polymer (G) is a polymer having a polyacrylate backbone, the number average molecular weight of the crosslinkable polymer (G) is preferably 1,000 to 300,000, more preferably 2,000 to 200,000, further preferably 3,000 to 150,000. A number average molecular weight of the crosslinkable polymer (G), of less than 1,000, is not preferable because compatibility with the component (A) is excessive to cause high hardness. On the other hand, a number average molecular weight of more than 300,000 does not enable the polymer to be compatible with the component (A), and causes a crosslinked state (network) not to be dense, resulting in inferior printing resistance.

The crosslinkable polymer (G) is preferably, for example, a polymer having at least one selected from the group consisting of a polyisoprene backbone, a polybutadiene backbone, a hydrogenated polybutadiene backbone, and a polyacrylate backbone. The crosslinkable polymer (G) is further preferably a polymer having at least one selected from the group consisting of a polybutadiene backbone and a polyacrylate backbone.

The crosslinkable polymer (G) is specifically configured from a homopolymer of a conjugated diene unsaturated compound, or a copolymer of a conjugated diene unsaturated compound and a monoethylenically unsaturated compound.

Examples of such a homopolymer of a conjugated diene unsaturated compound or such a copolymer of a conjugated diene unsaturated compound and a monoethylenically unsaturated compound include a butadiene polymer, an isoprene polymer, a chloroprene polymer, a styrene-chloroprene copolymer, an acrylonitrile-butadiene copolymer, an acrylonitrile-isoprene copolymer, a methyl methacrylate-isoprene copolymer, an acrylonitrile-isoprene copolymer, a methyl methacrylate-isoprene copolymer, a methyl methacrylate-chloroprene copolymer, a methyl acrylate-butadiene copolymer, a methyl acrylate-isoprene copolymer, a methyl acrylate-chloroprene copolymer, a methyl acrylate-chloroprene copolymer, an acrylonitrile-butadiene-styrene copolymer, and an acrylonitrile-chloroprene-styrene copolymer. In particular, liquid polybutadiene, a terminal-modified product of liquid polybutadiene by an OH group or a carboxyl group, a liquid acrylonitrile-butadiene copolymer, a carboxylic acid-modified product of a liquid acrylonitrile-butadiene copolymer, a liquid styrene-butadiene copolymer, and a carboxylic acid-modified acrylic polymer are preferable.

Any of liquid polybutadiene, a terminal-modified product of liquid polybutadiene, a liquid acrylonitrile-butadiene copolymer, a carboxylic acid-modified product of a liquid acrylonitrile-butadiene copolymer, a liquid styrene-butadiene copolymer, and a carboxylic acid-modified acrylic polymer is preferably used as the crosslinkable polymer (G) because not only kneadability and moldability and water developability are enhanced, but also the crosslinkable copolymer (G) can be easily mixed with the elastomer (B) to result in an enhancement in printing resistance.

The crosslinkable polymer (G) in the present embodiment can be obtained by introducing an ethylenically unsaturated group into a terminal and/or a side chain of a conjugated diene-based polymer.

The method for introducing an ethylenically unsaturated group into a terminal and/or side chain of a conjugated diene-based polymer is not particularly limited, and examples thereof include (1) a method including forming an ester bond of an monoethylenically unsaturated carboxylic acid such as (meth)acrylic acid and a hydroxyl group at a terminal of a conjugated diene-based polymer having such a hydroxyl group at such a terminal, by a dehydration reaction by use of hydrogen peroxide as a polymerization initiator, or forming an ester bond by a transesterification reaction of an monoethylenically unsaturated carboxylic acid alkyl ester such as methyl (meth)acrylate or ethyl (meth)acrylate, and (2) a method including copolymerizing a conjugated diene compound with an ethylenically unsaturated compound at least partially including an unsaturated carboxylic acid (ester) to provide a conjugated diene-based polymer, and reacting an ethylenically unsaturated alcohol such as allyl alcohol or vinyl alcohol with the resulting polymer.

The ethylenically unsaturated bond group in the crosslinkable polymer (G) is preferably based on (meth)acrylate.

The photosensitive resin composition for the flexographic printing plate of the present embodiment, which has a polybutadiene or polyacrylate backbone in the crosslinkable polymer (G), thus has favorable printing resistance. Furthermore, the crosslinkable polymer (G), which includes a structure having a carboxyl group in at least one kind of repeating unit, namely, an acid structure having an acid value of 1 or more and less than 400 mgKOH/g, thus has favorable developability with an aqueous developer.

The acid value in the crosslinkable polymer (G) is preferably 1 to 400 mgKOH/g.

The crosslinkable polymer (G) may contains two or more radically polymerizable, ethylenically unsaturated bond groups, and the content (the equivalent of the double bond) of the ethylenically unsaturated bond group is preferably 10 to 100,000 g/mol, more preferably 100 to 50,000 g/mol, further preferably 1,000 to 30,000 g/mol from the viewpoint that both printing resistance and developability are satisfied.

A commercially available product can also be used as the crosslinkable polymer (G) for use in the present embodiment, and specific examples thereof include polymers having a polybutadiene backbone, such as CN 307 (manufactured by Sartomer) and BAC-45 (manufactured by Osaka Organic Chemical Industry Ltd.); polymers having a polyisoprene backbone, such as UC102M (manufactured by Kuraray Co., Ltd.) and UC203M (manufactured by Kuraray Co., Ltd.); and polyacrylates such as MAP 2801 (manufactured by Negami Chemical Industrial Co., Ltd.).

The weight ratio of the crosslinkable polymer (G) and the hydrophilic copolymer (A) in the photosensitive resin composition (Mass of component (G)/Mass of component (A)) is preferably in the range of 1% or more and less than 30%, more preferably in the range from 2 to 25%, further preferably in the range from 5 to 20%. A weight ratio of less than 1% allows no sufficient printing resistance to be obtained. On the other hand, a weight ratio of more than 30% results in deterioration in developability with an aqueous developer. A weight ratio in the range of 1% or more and less than 30% enables both printing resistance and developability to be satisfied.

(Compound (H))

The photosensitive resin composition of the present embodiment may further contain at least one compound (H) selected from the group consisting of a surfactant and a (meth)acrylate monomer having a polyalkylene glycol chain.

Examples of the surfactant as the compound (H) which can be used in the present embodiment can include an anionic surfactant, an ionic surfactant, a nonionic surfactant, an anionic reactive surfactant, and a nonionic reactive surfactant.

Specific examples of the surfactant include anionic surfactants such as sodium polyoxyethylene styrenized phenyl ether sulfate, sodium polyoxyalkylene branched decyl ether sulfate, ammonium polyoxyethylene isodecyl ether sulfate, sodium polyoxyethylene tridecyl ether sulfate, sodium polyoxyethylene lauryl ether sulfate, ammonium polyoxyethylene lauryl ether sulfate, sodium polyoxyethylene alkyl ether sulfate (for example, NT-12 (manufactured by DKS Co., Ltd.)), ammonium polyoxyethylene oleyl cetyl ether sulfate, sodium polyoxyethylene oleyl cetyl ether sulfate, polyoxyethylene tridecyl ether phosphate, polyoxyethylene alkyl (C2 to C16) ether phosphate, a polyoxyethylene alkyl (C2 to C16) ether phosphate-monoethanolamine salt, sodium alkyl (C2 to C16) phosphate, an alkyl (C2 to C16) phosphate-monoethanolamine salt, disodium lauryl sulfosuccinate, disodium polyoxyethylene lauryl sulfosuccinate, disodium polyoxyethylene alkyl (C2 to C20) sulfosuccinate, sodium linear alkylbenzenesulfonate, linear alkylbenzenesulfonic acid, sodium α-olefinsulfonate, phenolsulfonic acid, sodium dioctyl sulfosuccinate, sodium lauryl sulfate, and a higher fatty acid potassium salt;
ionic surfactants such as alkyl (C8 to C20) trimethylammonium chloride, alkyl (C8 to C20) dimethylethylammonium chloride, didecyldimethylammonium chloride, lauryldimethylbenzylammonium chloride, stearyldimethylhydroxyethylammonium para-toluenesulfonate, stearyl dimethylaminopropylamide, tributylbenzylammonium chloride, lauryldimethylaminoacetic acid betaine, lauric acid amide propyl betaine, coconut oil fatty acid amide propyl betaine, octanoic acid amide propyl betaine, and lauryldimethylamine oxide;
nonionic surfactants such as polyoxyalkylene tridecyl ether, polyoxyethylene isodecyl ether, polyoxyalkylene lauryl ether, polyoxyalkylene alkyl ether, a mixture of polyoxyalkylene ether and polyether polyol, polyether polyol, polyoxyethylene sulfonated phenyl ether, polyoxyethylene naphthyl ether, phenoxyethanol, polyoxyethylene phenyl ether, polyoxyethylene polyoxypropylene glycol, polyoxyethylene lauryl ether, polyoxyethylene oleyl cetyl ether, polyoxyethylene oleate, polyoxyethylene distearate, polyoxyethylene glyceryl isostearate, polyoxyethylene hardened castor oil, coconut oil fatty acid diethanolamide, polyoxyethylene alkylamine, sorbitan trioleate, sorbitan sesquioleate, sorbitan monooleate, sorbitan monococoate, sorbitan monocaprate, polyoxyethylene sorbitan monococoate, polyoxyethylene sorbitan monostearate, polyoxyethylene sorbitan monooleate, octyl polyglycoside, butyl polyglycoside, sucrose benzoate, sucrose acetate, and sucrose fatty acid ester;
anionic reactive surfactants such as ammonium polyoxyethylene-1-(allyloxymethyl)alkyl ether sulfate and ammonium polyoxyethylene nonyl propenyl phenyl ether sulfate; and nonionic reactive surfactants such as polyoxyethylene nonyl propenyl phenyl ether.

Examples of the (meth)acrylate monomer having a polyalkylene glycol chain, as the compound (H) which can be used in the present embodiment, include polyethylene glycol mono(acrylate) and polyethylene glycol di(meth)acrylate including 2 or more and 20 or less of ethylene glycol chains, polypropylene glycol mono(meth)acrylate and polypropylene glycol di(meth)acrylate including 2 or more and 20 or less of propylene glycol chains, and polyethylene glycol polypropylene glycol di(meth)acrylate, cresyl polyethylene glycol (meth)acrylate, and nonylphenoxy polyethylene glycol (meth)acrylate each including 2 or more and 20 or less of polyethylene glycol chains and/or polypropylene glycol chains.

The surfactant and the (meth)acrylate monomer having a polyalkylene glycol chain, as the compound (H), may be used singly or in combinations of two or more kinds thereof.

Among such compounds (H), nonionic surfactants, nonionic reactive surfactants, and (meth)acrylate monomers having a polyalkylene glycol chain are preferable.

The content of the compound (H) is preferably 0.1 parts by mass or more and 15 parts by mass or less, more preferably 0.5 parts by mass or more and less than 10 parts by mass, further preferably 1 parts by mass or more and less than 5 parts by mass, with respect to 100 parts by mass of the hydrophilic copolymer (A). A content of less than 0.1 parts by mass tends to cause developability with an aqueous developer to be deteriorated, and a content of 15 parts by mass or more tends to cause an increase in the haze of the resulting photosensitive resin composition for a flexographic printing plate, an increase in the drying time after development, and/or deterioration in solvent resistance to an aqueous ink.

Not only essential or optional components described above, but also other various auxiliary additive components such as a plasticizer, a thermal polymerization inhibitor, an ultraviolet absorber, a halation preventing agent, and/or a light stabilizer can also be, if desired, added to the photosensitive resin composition for the flexographic printing plate of the present embodiment.

The acid value of the photosensitive resin composition for the flexographic printing plate of the present embodiment is 1 to 100 mgKOH/g.

An acid value of 1 to 100 mgKOH/g enables developability with an aqueous developer to be enhanced with water absorbability being suppressed.

The acid value is 1 mgKOH/g or more, preferably 5 mgKOH/g or more, more preferably 20 mgKOH/g or more from the viewpoint of developability. The acid value is 100 mgKOH/g or less, preferably 80 mgKOH/g or less, more preferably 60 mgKOH/g or less from the viewpoint of water resistance.

The acid value is preferably 5 to 80 mgKOH/g, more preferably 20 to 60 mgKOH/g.

A resin composition satisfying the above configuration can be suitably used in a photosensitive resin composition layer for a flexographic printing original plate, which is to be subjected to development by use of an aqueous developer.

The acid value in the photosensitive resin composition for the flexographic printing plate of the present embodiment can be determined by, for example, weighing 1 g of a sample, dispersing the sample in a mixed solvent of water and THF, and dropping an aqueous 0.1 mol/L potassium hydroxide solution thereinto to provide a neutralization point. Specifically, the acid value can be measured by a method described in Examples.

The acid value in the photosensitive resin composition for the flexographic printing plate of the present embodiment can be controlled to 1 to 100 mgKOH/g by, for example, adjusting the acid value(s) of the acidic group-containing polymer (F) and/or the crosslinkable polymer (G) containing two or more radically polymerizable, ethylenically unsaturated bond groups, and/or adjusting the compounding ratio thereof.

In the present embodiment, the photosensitive resin composition for the flexographic printing plate preferably has a structure where a phase including the hydrophilic copolymer (A) is separated from other phase including the elastomer (B), specifically has at least partially a structure like a so-called sea-island structure where the phase including the hydrophilic copolymer (A) corresponds to an island portion and other phase corresponds to a sea portion.

(Area ratio $S_A$)

In the present embodiment, when a cross section of a cured product of the photosensitive resin composition for the flexographic printing plate is observed, the proportion of the phase including the hydrophilic copolymer (A) (area ratio $S_A$) in the cross section of a cured product of the resin composition is preferably 15% or more and less than 50%.

The dispersing state of the phase including the hydrophilic copolymer (A) in the photosensitive resin composition can be confirmed by cutting out a thin section of the cured product of the photosensitive resin composition, and observing the section.

While the proportion (area ratio) of the phase including the hydrophilic copolymer (A) in the photosensitive resin composition is not different between an uncured product and the cured product, and a cross section of the uncured product can also be observed in the same manner as in the cross section of the cured product, the cross section of the cured product is more preferably observed because a liquid uncured product of the uncured product may be bled out.

The observation method is not limited, and can be made by, for example, transmission electron microscope (TEM) observation, scanning electron microscope (SEM) observation after staining of the thin section with osmium oxide, phosphotungstic acid, or the like, or observation with a phase mode or the like of a scanning probe microscope (SPM) of an atomic force microscope (AFM). In particular, such measurement with a phase mode or the like of a scanning probe microscope (SPM) of an atomic force microscope (AFM) is preferable because not only there is no need for staining of the sample and such measurement can be easily made only by cutting out the thin section from the resin composition, but also the phase including the hydrophilic copolymer (A) and other phase can be easily separated by relative comparison of the hardness of each of the phases. While such SPM measurement can be made with respect to both the resin composition before curing and the resin composition after curing, the respective phases may be reversed in terms of relative hardness due to polymerization of the photo-polymerizable monomer (C) in the course of curing. The phase including the hydrophilic copolymer (A) is softer than other phase in the resin composition before curing, and is reversed to be harder than other phase in the resin composition after curing, with respect to the resin composition of the present embodiment.

The proportion (area ratio) $S_A$ of the phase including the hydrophilic copolymer (A) can be determined specifically as follows.

A 30-μm square image is acquired by observation with the phase mode of SPM of the atomic force microscope. The resulting image is subjected to image processing (binarization) based on the phase difference exhibiting the information on relative hardness, the phase including the hydrophilic copolymer (A) and other phase (the phase including the elastomer (B)) are separated, the area of each phase including the hydrophilic copolymer (A) is determined, and the sum thereof (the total area of the phase including the hydrophilic copolymer (A)) is used to determine the proportion $S_A$ (% by area) of the phase including the hydrophilic copolymer (A) in the cross section of the cured product of the resin composition (specifically, the area ratio of the total area to the area (900 μm²) observed is determined).

In the present embodiment, the proportion (area ratio) $S_A$ of the phase including the hydrophilic copolymer (A) in the cross section of the cured product and the uncured product of the photosensitive resin composition for the flexographic printing plate is preferably 15% or more and less than 50%, more preferably 20% or more and less than 50%, further preferably 25% or more and less than 50%.

With respect to the proportion of the phase including the hydrophilic copolymer (A), an area ratio $S_A$ of 15% or more tends to impart a favorable speed of development with an aqueous developer, and an area ratio $S_A$ of less than 50% tends to impart favorable printing resistance.

In the present embodiment, the proportion of a phase having a phase area of 3 μm² or more and less than 100 μm² in the phase including the hydrophilic copolymer (A) is preferably 20% by area or more in observation of a 30-μm square cross section of a cured product of the photosensitive resin composition for the flexographic printing plate.

The proportion of the phase having a phase area of 3 μm² or more and less than 100 μm² in the phase including the hydrophilic copolymer (A) can be determined specifically as follows.

A 30-μm square image is acquired by observation with the phase mode or the like of SPM of the atomic force microscope. The resulting image is subjected to image processing based on the information on relative hardness, the phase including the hydrophilic copolymer (A) and other phase, namely, the phase including the elastomer (B) are separated, and the area of each phase including the hydrophilic copolymer (A) is determined to create histogram. The threshold in creation of the histogram is determined so that the phase image obtained by measurement is matched with the region of the phase including the hydrophilic copolymer (A), subjected to image processing. The histogram can be used to determine the proportion (%) of the sum of the area of a phase including the hydrophilic copolymer (A), having a phase area of 3 μm² or more and 100 μm² or less, to the total area of the phase including the hydrophilic copolymer (A).

In the present embodiment, the proportion of the phase having a phase area of 3 μm² or more and less than 100 μm² in the phase including the hydrophilic copolymer (A), obtained by the measurement and the image processing according to the above methods, is preferably 20% by area or more, more preferably 30% by area or more, further preferably 40% by area or more, still further preferably 50% by area or more.

The upper limit of the proportion is ideally 100% by area, and may be 99% or less or 98% or less.

It has found based on studies by the present inventors that the proportion of the phase having a phase area of 3 µm$^2$ or more and less than 100 µm$^2$ in the phase including the hydrophilic copolymer (A) can correspond to the proportion of the sum of the area in the range, to thereby allow the hydrophilic copolymer (A) and the phase including the elastomer (B) to be well admixed with each other, resulting in an enhancement in developability with an aqueous developer with high printing resistance and plate characteristics being kept.

The reason why a high proportion of the phase having a phase area of 3 µm$^2$ or more and less than 100 µm$^2$ enables developability with an aqueous developer to be enhanced is considered because the area of the phase including the hydrophilic copolymer (A) is as small as 3 µm$^2$ or more and less than 100 µm$^2$ to thereby increase the interface between the phase including the hydrophilic copolymer (A), which can serve as a starting point of development, and other phase. A too small size of the phase including the hydrophilic copolymer (A) also naturally causes deterioration in developability. Although the reason for this is not clear, it is considered that a too small size of the phase including the hydrophilic copolymer (A) causes a portion of a brush or the like in contact with the phase including the hydrophilic copolymer (A) to be small during scraping off by a mechanical unit, for example, such a brush in an aqueous developer, resulting in deterioration in developability.

On the other hand, a too large size of the phase including the hydrophilic copolymer (A) facilitates scraping off of the phase including the hydrophilic copolymer (A) by a brush or the like, and it is presumed that the phase including the hydrophilic copolymer (A), inferior in abrasion resistance in formation into a printing plate, compared with other phase, is larger to thereby easily cause abrasion and cracking of a printing plate to occur, resulting in deterioration in printing resistance.

The mechanisms of the effects of the present invention, however, are not limited to such presumptions.

When the resin composition of the present embodiment is formed into a cured product and a cross section of the cured product is observed, C/A is preferably 80% or more and 98% or less wherein the area of a region where the hydrophilic copolymer (A) is present is designated as A, the area of a region where an acid component is present, as observed by NanoIR is designated as B, and the area where A and B are matched is designated as C.

NanoIR in the present embodiment means a measurement method using an infrared spectroscopic analysis system having a nanometer scale spatial resolution, specifically, can provide a spectrum equivalent to a spectrum with FT-IR measurement conducted by irradiating a sample with a pulse laser from above of the sample, detecting the instantaneous expansion of the sample due to heat generated in absorption of infrared light by the sample, with a cantilever, and subjecting the signal detected, to Fourier transformation.

The area of the region where the hydrophilic copolymer (A) in the present embodiment is present, and the area of the region where an acid component is present, as observed by NanoIR, can be measured as follows.

An ultrathin section having a thickness of 200 nm to 500 nm is obtained from the cured product of the photosensitive resin composition for the flexographic printing plate, by use of a cryo microtome. A 5-µm square AFM image of the ultrathin section is acquired by use of AFM-IR NanoIR 2 manufactured by Anasys Instruments. Next, mapping data is obtained by mapping in the same measurement range at a wavelength where an acid component is observed, by use of Quantum Cascade Laser as a light source and a contact probe in a cantilever. For example, when the acidic group is carboxylic acid, such measurement is performed with such a wavelength being fixed to 1700 to 1710 cm$^{-1}$.

The resulting AFM image and mapping data are subjected to processing with image software as follows. First, each AFM image and each mapping data are converted into data where the respective numbers of longitudinal and lateral pixels are the same, then subjected to 8-bit processing and filtering processing, and thereafter subjected to binarization according to the Otsu's method, thereby determining the area of a phase including the hydrophilic copolymer, as A, and the area of a phase containing the acidic group, as B, with such an AFM image. A differential image between two images is further created, a matching portion is defined as C, and C/A is obtained from such an area C of the matching portion and the area A of the phase containing the hydrophilic copolymer, thereby enabling the area matching ratio to be determined. An area matching ratio of 50% means a random and mismatching state.

The area matching ratio C/A in the present embodiment is preferably 70% or more and 98% or less, more preferably 80% or more and 98% or less, further preferably 85% or more and 98% or less.

An area matching ratio C/A of 70% or more tends to enable an acidic group-containing polymer (F) to be highly contained in the phase containing the hydrophilic copolymer, resulting in an enhancement in developability with an aqueous developer, with water absorption resistance and water resistance being maintained.

Examples of the method of adjusting the area matching ratio C/A include various methods such as adjustment of the SP values of the hydrophilic copolymer (A) and the acidic group-containing polymer (F), and such adjustment to be performed at a timing of addition of the acidic group-containing polymer (F) in a method for producing a photosensitive resin composition for a flexographic printing plate, described below.

[Method for Producing Photosensitive Resin Composition for Flexographic Printing Plate]

The method for producing the above-mentioned photosensitive resin composition for a flexographic printing plate is preferably, for example, a production method including the following steps 1 to 3 in the listed order. Any known methods can be each applied to such steps.

Step 1; a step of adding the acidic group-containing polymer (F) and/or the crosslinkable polymer (G), and the plasticizer to a water dispersion liquid containing the hydrophilic copolymer (A), Step 2; a step of removing water from the water dispersion liquid containing the hydrophilic copolymer (A), obtained in step 1, to obtain a mixture including the hydrophilic copolymer (A), and Step 3; a step of adding the elastomer (B), the polymerizable unsaturated monomer (C), the photo-polymerization initiator (D), and the plasticizer (E) to the mixture obtained in step 2, and kneading the resultant.

The production method of the present embodiment tends to allow the plasticizer (E) and/or the acidic group-containing polymer (F) to be easily dispersed in the phase including the hydrophilic copolymer (A), consequently enabling aggregation of the hydrophilic copolymer (A) to be suppressed or prevented.

The mixture here used is specifically obtained by mixing at least an acidic group-containing compound (F) and the plasticizer (E), and optionally a compound (H) such as a surfactant, and a stabilizer and the like with the hydrophilic copolymer (A), and removing water by distillation or the like.

The method for removal of water may be made by use of a batch type drier such as a kneader, a Nauta mixer, or Ribocone, or by use of a continuous drier such as a devolatilization extruder, a thin film distillation machine, a CD drier, a KRC kneader, or an SC processor.

After a dry mixture is thus obtained, the mixture can be kneaded with the elastomer (B), the polymerizable unsaturated monomer (C), the photo-polymerization initiator (D), and the plasticizer (E) by use of any of various known kneading apparatuses such as an extruder, a Banbary mixer, and a kneader, thereby preparing a photosensitive resin composition increased in the acid strength of a region where the hydrophilic polymer is present (namely, enhanced in the area matching ratio).

[Flexographic Printing Original Plate]

A flexographic printing original plate or a flexographic printing plate of the present embodiment includes a support, and a photosensitive resin layer stacked on the support. The photosensitive resin layer comprises the above-mentioned photosensitive resin composition for the flexographic printing plate. Hereinafter, a flexographic printing plate including a flexographic printing original plate will be described in the order of the flexographic printing original plate and a flexographic printing plate after plate making. The content here described with respect to the flexographic printing original plate is also similarly applied to the flexographic printing plate after plate making.

The "flexographic printing plate" herein collectively means a flexographic printing original plate before plate making and a flexographic printing plate after plate making, unless particularly noted.

The flexographic printing original plate may include an adhesion layer between the support and the photosensitive resin layer, an infrared-sensitive layer stacked on the photosensitive resin layer, and a cover film stacked on the infrared-sensitive layer.

(Support)

The support is not particularly limited, and examples thereof include a support film. Examples of the support film include a polypropylene film, a polyethylene film, a film of polyester such as polyethylene terephthalate and polyethylene naphthalate, and a polyamide film, The support film is preferably a dimensionally stable polyester film having a thickness of 75 μm or more and 300 μm or less.

(Adhesion Layer)

The adhesion layer is preferably further included between the support and the photosensitive resin layer. The adhesion layer is not particularly limited, and examples thereof include one whose composition has a binder polymer such as polyurethane, polyamide, or a thermoplastic elastomer, and a component effective for adhesion, such as an isocyanate compound or an ethylenically unsaturated compound. Furthermore, various auxiliary additive components such as a plasticizer, a thermal polymerization inhibitor, an ultraviolet absorber, a halation preventing agent, a light stabilizer, a photo-polymerization initiator, a photo-polymerizable monomer, and a dye can be added to the adhesive layer. At least one underlying layer is preferably further included between the adhesion layer and a polyester film as the support in order to impart a higher adhesion force.

(Protective Layer and Infrared-Sensitive Layer)

The photosensitive resin composition constituting the photosensitive resin layer usually has tackiness, and thus a solvent-soluble protective layer may be further provided on the surface of the photosensitive resin layer in order to improve contactability with a negative film to be stacked in plate making or to enable such a negative film to be reused. Such a protective layer includes a substance soluble in a solvent for use as a washout liquid, and is preferably thin and flexible. Examples of the protective layer include protective layers including crystalline 1,2-polybutadiene, soluble polyamide, partially saponified polyvinyl acetate, and cellulose ester, and in particular, soluble polyamide is preferable. The surface of the photosensitive resin layer may be directly coated with a solution obtained by dissolving such a substance in a proper solvent, or a film of polyester, polypropylene, or the like may be coated with the substance once and the film coated with the substance may be laminated on and transferred onto the photosensitive resin layer.

The protective layer may also be an infrared-sensitive layer including an infrared-sensitive substance, and the infrared-sensitive layer may be directly cut by an infrared laser (hereinafter, also referred to as "laser drawing") to thereby allow the protective layer by itself to be negative. In all cases, the protective layer is also removed at the same time as washing out of an unexposed region after exposure.

The infrared-sensitive layer is preferably constituted by a binder polymer, an infrared-sensitive substance, and a non-infrared radiation shielding substance. Examples of the binder polymer include polyamide, polyester, and a copolymer of monovinyl-substituted aromatic hydrocarbon and conjugated diene.

In particular, a copolymer of monovinyl-substituted aromatic hydrocarbon such as styrene, α-methylstyrene, or vinyl toluene, and conjugated diene such as 1,3-butadiene or isoprene is preferable, A non-infrared radiation shielding layer constituted with the binder polymer is high in affinity with and favorable in adhesion properties to the photosensitive composition resin.

In the case of use of polyester as the binder polymer, the number average molecular weight is preferably 300 or more and 10,000 or less.

Furthermore, examples of the polyester can suitably include polyester synthesized from alkanediol and adipic acid, polyester synthesized from alkanediol and phthalic acid, polycaprolactone, and any combination of two or more of such polyesters. The polyester may include various functional groups such as an amino group, a nitro group, a sulfonic acid group, and halogen as long as compatibility with others, for example, the binder polymer, the infrared-sensitive substance, and the non-infrared radiation shielding substance is not impaired.

The infrared-sensitive substance suitably used is, for example, a single substance or a compound having a strong absorbance in the range from 750 to 2000 nm, Specific examples of the infrared-sensitive substance include inorganic pigments such as carbon black, graphite, copper chromite, and chromium oxide; and coloring matter such as a polyphthalocyanine compound, cyanine coloring matter, and metal thiolate coloring matter.

Such an infrared-sensitive substance is added in a range so as to impart sensitivity where cleavage can be made by laser light used. In general, addition in an amount of 10 to 80% by mass is effective. The non-infrared radiation shielding substance which can be used is a substance which reflects or absorbs radiation such as ultraviolet light. Preferable examples thereof include an absorber of radiation such as ultraviolet light, carbon black, and graphite, and an amount to be added is set so that a required optical density can be achieved. In general, addition is preferably made so that such an optical density is 2 or more, preferably 3 or more.

A method for producing a flexographic printing original plate of the present embodiment is not particularly limited, and such a flexographic printing original plate can be prepared by various methods. Specifically, the following method is exemplified.

Examples can include a method including first dissolving raw materials of the photosensitive resin composition in a proper solvent, for example, a solvent such as chloroform, tetrachloroethylene, methyl ethyl ketone, or toluene, to mix the resulting solution, and casting the solution into a mold to evaporate the solvent, thereby forming a plate, and a method including kneading the raw materials by a kneader, a roll mill, or a screw extruder without any solvent, and then molding them in a desired thickness by a calender roll, pressing, or the like.

In order that the protective layer or the infrared-sensitive layer is provided on the surface of the photosensitive resin layer, for example, a component constituting the protective layer or the infrared-sensitive layer may be dispersed or dissolved in a proper solvent by forced stirring or ultrasonic stirring with a stirring blade, or may be preliminarily kneaded with an extruder or a kneader and then dispersed or dissolved in a proper solvent, and thereafter the photosensitive resin layer may be directly coated with the resulting dispersion liquid or solution. Furthermore, a cover sheet made of polyester, polypropylene, or the like may also be provided on the protective layer or the infrared-sensitive layer. Alternatively, such a cover sheet may also be coated with the solution for the protective layer or the infrared-sensitive layer to form a protective film, and thereafter the protective film may be laminated or pressure-bonded by pressing on the photosensitive layer, and thus transferred.

The protective film and the support can be usually allowed to closely adhere to the photosensitive resin composition by roll lamination after sheet molding of the photosensitive resin composition, and laminated and then pressed with heating to thereby provide a photosensitive resin layer further favorable in thickness accuracy.

A cover film may also be provided on the protective layer in the printing original plate.

(Area Ratio SA)

For the flexographic printing original plate or the flexographic printing plate of the present embodiment, when a cross section of the photosensitive resin layer of the flexographic printing plate is observed, the proportion (area ratio SA) of the phase including the hydrophilic copolymer (A) in the cross section of the cured product of the resin composition is preferably 15% or more and less than 50%. The above-mentioned content with respect to the cross section of the cured product of the photosensitive resin composition is also similarly applied to the cross section of the photosensitive resin layer of the flexographic printing plate.

[Flexographic Printing Plate]

The following method is generally adopted for making the flexographic printing plate from the flexographic printing original plate. The flexographic printing plate of the present embodiment is produced from the flexographic printing original plate of the present embodiment.

First, the entire surface of the flexographic printing original plate is exposed to ultraviolet light through the support film (back exposure), to cure the photosensitive resin composition, to form a thin uniform cured layer.

Next, a negative film is placed on the photosensitive resin layer, and the surface of the photosensitive resin layer is subjected to image exposure (relief exposure) through the negative film or directly from above of an ultraviolet light shielding layer provided on the photosensitive resin layer after laser drawing of the ultraviolet light shielding layer.

Next, an unexposed region is removed by washing with a solvent-based developer or an aqueous developer, or an unexposed region heated to 40° C. to 200° C. is removed by contacting with an absorption layer which can make absorption, and removal of the absorption layer. Furthermore, the resultant can be subjected to post-exposure, thereby providing the flexographic printing plate.

The exposure through the negative film or the ultraviolet light shielding layer (relief exposure) or the exposure through the support film (back exposure) may be performed previously, or such exposures may be performed at the same time. Examples of an exposure light source include a high-pressure mercury lamp, an ultraviolet fluorescent lamp, a carbon arc lamp, and a xenon lamp.

An infrared laser can be used in the laser drawing, and the infrared laser preferably used is a laser having wavelengths of 750 to 2000 nm. An infrared laser having such wavelengths is generally a semiconductor laser having wavelengths of 750 to 880 nm or a Nd-YAG laser having a wavelength of 1060 nm.

When the unexposed region is developed by a solvent, such a development solvent is not particularly limited, and examples thereof can include esters such as heptyl acetate and 3-methoxybutyl acetate; hydrocarbons such as an oil fraction, toluene, and decalin; a mixture of alcohol such as propanol, butanol, or pentanol alcohol with a chlorine-based organic solvent such as tetrachloroethylene; water; and ethers such as polyoxyalkylene alkyl ether.

When the unexposed region is developed by an aqueous developer, the aqueous developer is a developer containing water as a main component, and may be water by itself, or may be, for example, water to which a nonionic or anionic surfactant, and, if necessary, a pH adjuster, a development aid and the like are compounded.

The nonionic surfactant is not particularly limited, and examples thereof include polyoxyalkylene alkyl or alkenyl ether, polyoxyalkylene alkyl or alkenyl phenyl ether, polyoxyalkylene alkyl or alkenylamine, polyoxyalkylene alkyl or alkenylamide, and ethylene oxide/propylene oxide block adducts.

The anionic surfactant is not particularly limited, and examples thereof include linear alkylbenzenesulfonate having alkyl having an average number of carbon atoms of 8 to 16, α-olefinsulfonate having an average number of carbon atoms of 10 to 20, dialkylsulfosuccinate having a alkyl group or alkenyl group having 4 to 10 carbon atoms, fatty acid lower alkyl ester sulfonate, alkyl sulfate having an average number of carbon atoms of 10 to 20, alkyl ether sulfate which has a linear or branched alkyl group or alkenyl group having an average number of carbon atoms of 10 to 20, or to which 0.5 to 8 mol in average of ethylene oxide is added, and a saturated or unsaturated fatty acid salt having an average number of carbon atoms of 10 to 22.

The pH adjuster is not particularly limited, and examples thereof include sodium borate, sodium carbonate, silicate soda, metasilicate soda, sodium succinate, and sodium acetate. In particular, silicate soda is preferable because silicate soda is easily soluble in water.

Furthermore, a development aid may also be added to the developer. The "development aid" means one which allows the developer to be enhanced in development ability by combination use of the surfactant and the pH adjuster. Examples of the development aid include amines such as monoethanolamine, diethanolamine, and triethanolamine, ammonium salts such as tetramethylammonium hydroxide, and paraffin-based hydrocarbon.

At least one or more selected from the group consisting of the nonionic and anionic surfactants, the pH adjuster, and the development aid can be each added to and mixed with the developer in the range from 0.1 to 50% by mass, preferably in the range from 1 to 10% by mass, and thus used.

During the development, supplementarily, the printing original plate may be vibrated by ultrasound or the like, the surface of the printing original plate may be rubbed with a mechanical unit such as a brush, or the developer may be sprayed through a nozzle.

A silicone component may be added to the solvent-based and/or aqueous developer at a rate of 0.01% or more and 5% or less from the viewpoint that a clear print can be obtained and a flexographic printing plate in which ink fill-in is suppressed and which is excellent in ink transfer properties is obtained. The silicone component which can be used is the same as in the silicone compound in the (e) of the photosensitive resin layer. The silicone component to be included in the developer, as the silicone compound, is preferably silicone oil modified by an amino group, a polyether group, a carbinol group, or the like.

The absorption layer in thermal development is not particularly limited, and examples thereof include respective absorption layers including a nonwoven material, paper material, a fiber fabric, continuous bubble foam, and a porous material. The absorption layer is not particularly limited, and is preferably a nonwoven material including nylon, polyester, polypropylene, or polyethylene, or a combination of such nonwoven materials, more preferably a nonwoven continuous web of nylon or polyester.

Examples of post-treatment exposure include a method including irradiating the surface with light at wavelengths of 300 nm or less. Light at wavelengths of more than 300 nm may be, if necessary, used in combination.

The photosensitive resin layer of the flexographic printing original plate of the present embodiment is useful for both solvent development and thermal development, and can be particularly suitably used for solvent development in terms of high image reproductivity of the printing plate.

The method for producing the flexographic printing plate of the present embodiment may include coating the flexographic printing plate after development with a silicone component and/or a fluorine-based compound before post-treatment exposure from the viewpoint that a clear print can be obtained and a flexographic printing plate in which ink fill-in is suppressed and which is excellent in ink transfer properties is obtained.

The silicone component for coating may be reactive silicone or non-reactive silicone, and examples thereof suitably include (meth)acrylic-modified silicone.

Examples of the fluorine-based compound for coating include a polyethylene fluoride compound, a poly(ethylene-ethylene fluoride) compound, an acrylic copolymer having a perfluoroalkyl group in a side chain, a urethane-based polymer having a perfluoroalkyl group, an ester-based polymer having a perfluoroalkyl group, or a fluorine-based monomer.

A (meth)acrylic-modified reactive silicone oil and a fluorine-based compound may be each used in combination of two or more kinds thereof.

The silicone component and/or the fluorine-based compound are/is preferably dissolved in a solvent and used in the form of a solution thereof.

The solvent is preferably a solvent which can be attached onto the surface of a resin plate and permeate the vicinity of the surface. A solvent which can permeate the surface of a resin plate can be selected and a post-exposure step can be made, thereby allowing such a (meth)acrylic-modified silicone component and/or the fluorine-based compound to be further strongly fixed to the surface (vicinity) of a resin.

The solution containing the silicone component and/or the fluorine-based compound preferably has a concentration of the silicone component and/or fluorine-based compound, of 0.05 to 50% by mass.

The solvent which can be used is, for example, a solvent such as hydrocarbon, acetate, alcohol, ketone, or glycol ether. Such solvents may be used singly or in combinations of two or more kinds thereof. The solvent can also be any one where the solvent such as paraffin or glycol ether is used in combination with water, or where a nonionic surfactant high in permeation force is added to water, in order to allow the solvent to permeate the surface of a photosensitive resin plate.

Any additive(s) such as a defoamer, an antioxidant, or an antiseptic agent may be, if necessary, added to the solution containing the silicone component and/or the fluorine-based compound.

Examples of the method for coating the surface of a photosensitive resin plate include spray coating with a solution, brush coating, dipping, a method of coating with a solution by a cloth or sponge, and a method including development, then addition to a rinse liquid, and dropping onto the surface of the plate, and in particular, spray coating with a solution is preferable. Such coating may be performed immediately after development or performed after development and drying as long as it is performed before post-exposure.

The amount of abrasion of flexographic printing plate of the present embodiment is preferably 10 mg/cm$^2$ or less in an abrasion resistance test of a solid portion with a Taber abrasion tester run 1000 times after immersion in a 10% IPA solution for 24 hours, and the amount of abrasion thereof is 20 mg or less in an abrasion resistance test of a rhombic pattern with a Taber abrasion tester run 2000 times. Measurement of such amounts of abrasion is described in Examples specifically described below.

[Copolymer for Photosensitive Resin Composition]

A copolymer of the present embodiment contains the above carboxyl group-containing unsaturated monomer unit, conjugated diene-based monomer unit, aromatic vinyl compound unit, and alkyl (meth)acrylate unit.

The copolymer of the present embodiment contains 3.0 parts by mass or more and 25 parts by mass or less of the carboxyl group-containing unsaturated monomer unit, 20 parts by mass or more and 60 parts by mass or less of the conjugated diene-based monomer unit, 10 parts by mass or more and 30 parts by mass or less of the aromatic vinyl compound unit, and 25 parts by mass or more and 45 parts by mass or less of the alkyl (meth)acrylate unit, with respect to a total amount of the monomer unit contained in the copolymer of 100 parts by mass, as in the above-mentioned hydrophilic copolymer (A).

The copolymer of the present embodiment has hydrophilicity and is used for the photosensitive resin composition. The copolymer of the present embodiment can also provide the flexographic printing original plate.

It is preferable as in the above-mentioned hydrophilic copolymer (A) that the copolymer have a gel fraction of 80% or more and 99% or less and the copolymer have a degree of swelling in toluene of 3.0 or more and 15 or less.

It is preferable as in the above-mentioned hydrophilic copolymer (A) that the copolymer have a water absorption rate of the film of 30% or more.

The hydrophilic copolymer (A) in the present embodiment can be used by removal of water according to various methods. The method for removal of water may be specifically made by, for example, solidifying the polymer by use of an aggregating agent such as sulfate, nitrate, hydrochloride, carbonate, or carboxylate, and then removing water in a dehydration step such as centrifugation, and a drying step, or mixing the hydrophilic copolymer (A) singly or the hydrophilic copolymer (A) and at least one or more compounds including the plasticizer (E), the compound (H) such as the surfactant, and a stabilizer, and then removing water by distillation. The method for removal of water by distillation or the like may be made by use of a batch type drier such as a kneader, a Nauta mixer, or Ribocone, or by use of a continuous drier such as a devolatilization extruder, a thin film distillation machine, a CD drier, a KRC kneader, or an SC processor.

After a dry product of the hydrophilic copolymer (A), or a dry mixture of the hydrophilic copolymer (A) and at least one or more of the plasticizer (E), the compound (H) such as a surfactant, and a stabilizer and the like is thus obtained, such a product or mixture can be kneaded with the elastomer (B), the polymerizable unsaturated monomer (C), and the photo-polymerization initiator (D) by use of any of various known kneading apparatuses such as an extruder, a Banbary mixer, and a kneader, thereby preparing a photosensitive resin composition for a flexographic printing plate.

The resulting photosensitive resin composition for a flexographic printing plate can be used to form a photosensitive layer having a desired thickness by hot press molding, a calender treatment, extrusion, or the like.

The flexographic printing original plate of the present embodiment includes at least the photosensitive resin composition for the flexographic printing plate of the present embodiment, or includes a photosensitive layer including the photosensitive resin composition for the flexographic printing plate.

The flexographic printing original plate of the present embodiment may be a stacked article where the photosensitive layer is provided on the support such as polyester in order to maintain accuracy as a printing plate.

An infrared ablation layer for direct drawing onto the photosensitive layer, or a flexible film layer (also referred to as "transparent image carrier layer" or "adhesion prevention layer".) which can be developed in water, for the purposes of improving contactability with a negative film and of enabling a negative film to be reused, may also be provided on a surface of the photosensitive layer, opposite to the support.

The support, the infrared ablation layer, and the flexible film layer can be, for example, allowed to closely adhere to the photosensitive layer by roll lamination after formation of the photosensitive layer into a sheet. The photosensitive layer can also be enhanced in surface accuracy after such lamination and furthermore hot pressing.

Examples of an active light source for use in photo-curing (formation of a latent image) of the photosensitive layer on the flexographic printing original plate of the present embodiment include a low-pressure mercury lamp, a high-pressure mercury lamp, an ultraviolet fluorescent lamp, a carbon arc lamp, a xenon lamp, a zirconium lamp, and sunlight.

In the present embodiment, the photosensitive layer of the flexographic printing original plate is irradiated with light through the infrared ablation layer or the transparent image carrier after drawing, thereby forming a latent image, and a region not irradiated is removed by use of an aqueous developer (development), thereby providing a relief (printing plate).

The aqueous developer is a developer containing water as a main component, and may be water by itself, or may be, for example, water to which a nonionic or anionic surfactant, and, if necessary, a pH adjuster, a development promoter, and the like are compounded.

Examples of the nonionic surfactant include polyoxyalkylene alkyl or alkenyl ether, polyoxyalkylene alkyl or alkenyl phenyl ether, polyoxyalkylene alkyl or alkenylamine, polyoxyalkylene alkyl or alkenylamide, and ethylene oxide/propylene oxide block adducts.

Examples of the anionic surfactant include linear alkylbenzenesulfonate having alkyl having an average number of carbon atoms of 8 to 16, α-olefinsulfonate having an average number of carbon atoms of 10 to 20, dialkylsulfosuccinate having a alkyl group or alkenyl group having 4 to 10 carbon atoms, fatty acid lower alkyl ester sulfonate, alkyl sulfate having an average number of carbon atoms of 10 to 20, alkyl ether sulfate which has a linear or branched alkyl group or alkenyl group having an average number of carbon atoms of 10 to 20, or to which 0.5 to 8 mol in average of ethylene oxide is added, and a saturated or unsaturated fatty acid salt having an average number of carbon atoms of 10 to 22.

Examples of the pH adjuster include sodium borate, sodium carbonate, silicate soda, metasilicate soda, sodium succinate, and sodium acetate. Silicate soda is preferable as the pH adjuster because silicate soda is easily soluble in water.

Furthermore, a development aid may also be added to the developer. The "development aid" means one which allows the developer to be enhanced in development ability by combination use with the surfactant and the pH adjuster. Examples of the development aid include amines such as monoethanolamine, diethanolamine, and triethanolamine, ammonium salts such as tetramethylammonium hydroxide, and paraffin-based hydrocarbon.

Such a development aid can be, for example, used with being usually added to and mixed with the developer in the range from 0.1 to 50% by mass, preferably in the range from 1 to 10% by mass.

During the development, supplementarily, the printing original plate may be vibrated by ultrasound or the like, or the surface of the printing original plate may be rubbed with a mechanical unit such as a brush.

The printing plate after development is preferably dried in an oven, for example, at 50° C. for 15 to 120 minutes.

The photosensitive layer including the photosensitive resin composition of the present embodiment may still have stickiness on the plate surface depending on the composition, even after completion of drying. In such a case, such stickiness can be removed by a known surface treatment method. Such a surface treatment method is preferably an exposure treatment with active light having wavelengths of 300 nm or less.

EXAMPLES

Hereinafter, the present invention will be more specifically described with reference to Examples, but the present invention is not limited thereto.

Production Example 1: Synthesis of Hydrophilic Copolymer (A)-Containing Mixture Including Plasticizer A pressure-proof reaction vessel equipped with a stirring apparatus and a jacket for temperature regulation was initially charged with 125 parts by mass of water and 2 parts by mass of an (α-sulfo(1-nonylphenoxy)methyl-2-(2-propenyloxy)ethoxy-poly(oxy-1,2-ethanediyl) ammonium salt "ADEKA REASOAP SE1025" (manufactured by Adeka Corporation) as a reactive emulsifier, and the internal temperature was raised to 80° C. An oily mixture of a monomer mixture including 10 parts by mass of styrene, 50 parts by mass of butadiene, 32 parts by mass of butyl acrylate, 5 parts by mass of methacrylic acid, and 2 parts by mass of acrylic acid, with 2 parts by mass of t-dodecylmercaptan, and an aqueous solution including 20 parts by mass of water, 1.2 parts by mass of sodium peroxodisulfate, 0.2 parts by mass of sodium hydroxide, and 2 parts by mass of an (α-sulfo(1-nonylphenoxy)methyl-2-(2-propenyloxy)ethoxy-poly(oxy-1,2-ethanediyl) ammonium salt were added at constant flow rates over 5 hours and 6 hours, respectively.

Next, the resultant was kept at a temperature of 80° C. for 1 hour as it was, and cooled after completion of a polymerization reaction. Furthermore, the pH of a copolymer latex produced was adjusted to 7 by sodium hydroxide, thereafter an unreacted monomer was removed by a steam stripping method, the resultant was subjected to filtering by a 200-mesh wire cloth, and the solid concentration of a filtrate was adjusted so as to finally reach 40% by mass, thereby providing a water dispersion liquid of a hydrophilic copolymer (A), for use in Examples.

Ten parts by mass of liquid polybutadiene [LBR352: manufactured by Kuraray Co., Ltd.] as a plasticizer (E), and 100 parts by mass of a liquid carboxylic acid-modified acrylic polymer (F) [CBB-3098: manufactured by Soken Chemical & Engineering Co., Ltd.], with respect to 100 parts by mass of the water dispersion liquid, were dried under reduced pressure at 80° C. with mixing, thereby providing a mixed dry product of the hydrophilic copolymer (A), the plasticizer (E), and the liquid carboxylic acid-modified acrylic polymer (F).

Production Example 2: Synthesis of Hydrophilic Copolymer (A)-Containing Mixture Including Plasticizer (E), Used in Comparative Example 2-4

After a water dispersion liquid of the hydrophilic copolymer (A) was obtained in the same manner as in Production Example 1, 10 parts by mass of liquid polybutadiene [LBR352] as a plasticizer (E) was added with respect to 100 parts by mass of the hydrophilic copolymer included in the water dispersion liquid, and dried under reduced pressure at 80° C. with mixing, thereby providing a mixed dry product of the hydrophilic copolymer (A) and the plasticizer (E).

Production Example 3: Production of Infrared Ablation Layer

Mixed were 10 parts by mass of an ethylene-acrylic acid copolymer [SG-2000: manufactured by Namariichi Co., Ltd., aqueous 20% by mass solution] as an anionic polymer having a carboxylic acid group as an anionic polar functional group, 5 parts by mass of carbon black [BONJET CW-2: manufactured by Orient Chemical Industries Co., Ltd., aqueous 20% by mass solution], 0.05 parts by mass of a release agent [KF-351: manufactured by Shin-Etsu Chemical Co., Ltd.], 30 parts by mass of water, and 15 parts by mass of ethanol, thereby providing a coating solution for ablation layer formation.

A PET film having a thickness of about 100 μm, serving as a cover film, was coated with the coating solution for ablation layer formation so that the thickness after drying was 3 μm, and the resultant was subjected to a drying treatment at 90° C. for 2 minutes, thereby providing a stacked article of an ablation layer and a cover film.

Example 1

(1) Production of Photosensitive Resin Composition

After 150 parts by mass of the mixture obtained Production Example 1, including the hydrophilic copolymer (A), the plasticizer (E) and the liquid carboxylic acid-modified acrylic polymer (F), and 100 parts by mass of a styrene-butadiene-styrene copolymer [D-KX405: manufactured by Kraton Corporation] were mixed at 140° C. by use of a pressure kneader, a mixture of 110 parts by mass of liquid polybutadiene [LBR-352: manufactured by Kuraray Co., Ltd.], 10 parts by mass of 1,9-nonanediol diacrylate, 10 parts by mass of 1,6-hexanediol dimethacrylate, 5 parts by mass of 2,2-dimethoxyphenylacetophenone, 2 parts by mass of a surfactant: [polyoxyethylene alkyl ether (NT-12): manufactured by Nippon Nyukazai Co., Ltd.], and 5 parts by mass of 2,6-di-t-butyl-p-cresol was added in portions over 15 minutes, and the resultant was kneaded for 20 minutes after completion of the addition, thereby providing a photosensitive resin composition.

(2) Production of Printing Original Plate

The photosensitive composition was taken out and sandwiched between a polyester film (hereinafter, abbreviated as "PET") coated with an elastomer-containing adhesive, having a thickness of 100 μm, and PET coated with a polyvinyl alcohol (PVA) layer of 5 μm thickness, having a thickness of 100 μm, the resultant was formed into a plate having a thickness of 1.14 mm by use of a pressing machine heated to 120° C., and then the PET coated with the PVA layer was peeled, thereby providing a stacked article including a support (PET)-photosensitive layer.

The infrared ablation layer obtained in Production Example 3 was laminated on the resulting stacked article so as to be in contact with the photosensitive layer, thereby providing a printing original plate.

(3) Production of Printing Plate

The printing original plate was exposed through the support (the PET coated with the adhesive) thereof by use of an ultraviolet exposure machine (JE-A2-SS manufactured by Nihon Denshi Seiki Co., Ltd.) so that the height (RD) of a pattern after curing was about 0.6 mm.

Next, the cover film of the infrared ablation layer was peeled, drawing was made on the infrared ablation layer by use of a laser drawing machine (CDI) manufactured by Esko-Graphics bvba, and thereafter the resultant was exposed through the infrared ablation layer thereof by the exposure machine for 10 minutes.

After the exposure, an aqueous 1% Nissan Soap solution (aqueous developer) was prepared, development (development) was made at 40° C. by use of a developing machine (JOW-A3-P) manufactured by Nihon Denshi Seiki Co., Ltd., thereby removing an unexposed region. Herein, the development time was defined as a time calculated with the thickness d (mm) of a printing original plate which was not exposed, but developed for 5 minutes and thus etched, as measured in advance, according to RD×d×1.5 (min) depending on a desired height of a pattern (RD=0.6 (mm)).

After drying, post-exposure was performed by an ultraviolet germicidal lamp or an ultraviolet chemical lamp, thereby providing a printing plate.

(4) Evaluation Methods (a) Measurement of Acid Value of Resin Composition for Flexographic Printing Plate, Acidic Group-Containing Polymer (F), and Crosslinkable Polymer (G)

The acid value of the resin composition for a flexographic printing plate was determined by, for example, weighing 1 g of the resin composition, adding the resin composition to 50 mL of a mixed solvent of water and THF (volume ratio (water:THF): 5:5), stirring the resultant at 40° C. for 1 hour, and thereafter dropping an aqueous 0.1 mol/L potassium hydroxide solution thereinto to provide a neutralization point.

(b) Evaluation of Developability (Water Developability) of Printing Original Plate A developing machine (JOW-A3-P) manufactured by Nihon Denshi Seiki Co., Ltd. was filled with an aqueous 1% Nissan Soap solution, the cover film of the infrared ablation layer of the printing original plate obtained in (2) was peeled and the resultant was subjected to development at 40° C. for 5 minutes. The time (min) taken for development of 1 mm thickness was measured. A shorter development time was more preferable, and a development time of less than 10 minutes/mm was rated as "⊚", a development time of less than 15 minutes/mm was rated as "○", a development time of less than 20 minutes/mm was rated as "Δ", and a development time of 20 minutes/mm or more was rated as "x".

(c) Evaluation of Printing Resistance of Printing Plate

[Abrasion Resistance of Solid Portion]

The strength of the surface of the printing plate (printing resistance) was evaluated by use of an abrasive wheel (Taber abrasion tester manufactured by Tester Sangyo Co., Ltd., rigid abrasive wheel) in a simulated manner. A printing plate whose entire surface corresponded to a solid portion was produced, the printing plate was immersed in an aqueous 10% isopropyl alcohol solution as an alternative of an aqueous ink for 24 hours, and thereafter the amount of abrasion of the surface of the plate after 1000 rotations was measured with an H22 abrasive wheel under a load of 50 g. The amount of abrasion was determined by dividing the rate of decrease by the contact area of the wear ring with the solid portion. An amount of abrasion of 2 mg/cm$^2$ or less was rated as "⊚", an amount of abrasion of less than 10 mg/cm$^2$ was rated as "○", and an amount of abrasion of 10 mg/cm$^2$ or more was rated as "x",

[Abrasion Resistance of Rhombic Pattern]

The strength of the surface of the printing plate (printing resistance) was evaluated by use of an abrasive wheel (Taber abrasion tester manufactured by Tester Sangyo Co., Ltd., rigid abrasive wheel) in a simulated manner. A printing plate having a design including a 3-mm square rhombic pattern and a 3-mm width line was produced, and the amount of abrasion of the surface of the plate after 2000 rotations was measured with an H38 abrasive wheel under a load of 250 g. An amount of abrasion of 20 mg or less was rated as "⊚", an amount of abrasion of less than 30 mg was rated as "○", and an amount of abrasion of 30 mg or more was rated as "x".

(d) Evaluation of Transparency (Haze) of Printing Original Plate

The photosensitive resin composition produced in (1) was sandwiched between two PET films subjected to a release treatment, having a thickness of 100 μm, and the resultant was formed into a plate having a thickness of 1.14 mm by use of a pressing machine heated to 120° C. The haze of such a plate not cured, which was formed so as to have a thickness of 1.14 mm, was measured by use of a haze meter (NDH-5000) manufactured by Nippon Denshoku Industries Co., Ltd. A haze of 30 or less was rated as "○", a haze of more than 30 and less than 50 was rated as "Δ", and a haze of 50 or more was rated as "x".

Furthermore, the plate formed was left to still stand in a constant-temperature bath at 40° C. and 80% RH for one week.

A difference between the initial haze and the haze after the standing for one week (moisture absorption haze) of 30 or less was rated as "○", a difference of more than 30 and less than 50 was rated as "Δ", and a difference of 50 or more was rated as "x".

(e) Water Resistance (Water Swelling Rate)

The printing plate produced in (3) was immersed in water for 24 hours, and the rate of increase (%) from the weight before such immersion was calculated. A smaller rate means a more preferable value. A rate of 1.5% or less was defined as passing.

A rate of 1.5% or less was rated as "○" and a rate of more than 1.5% was rated as "Δ".

(f) Proportions of Phase Area and Sum of Area of Phase Having Phase Area of 3 μm$^2$ or More and Less than 100 μm$^2$ A formed article exposed was cut horizontally to a sheet from the center of the article to provide a small piece, and a cut surface was obtained by a cryo microtome, thereby providing a thin section as a sample for observation.

The cross section of the thin section was observed by use of a scanning probe microscope (SPM) of an atomic force microscope (AFM) [Dimension Icon] manufactured by Bruker Japan K.K. In the observation, the Tapping mode was selected, and a rectangular cantilever made of Si, having a length of 125 μm, a width of 40 μm, and a thickness of 4 μm, was used as a cantilever. The cantilever was commercially available as NCHV from Bruker Japan K.K., and had a constant of spring of about 40 N/m.

Data processing was performed by use of data processing software Nanoscope Analysis attached to Dimension Icon. A phase image was displayed as illustrated in FIG. 1, to correct distortion of the whole image with Plane fit processing, and thereafter a bright region which corresponded to the phase including the hydrophilic copolymer (A) was made uniform with Flatten processing.

Next, binarization was made by Particle Analysis with respect to the phase including the hydrophilic copolymer (A) and the phase including the elastomer (B) as illustrated in FIG. 2, thereby determining the area ratio of the phase including the hydrophilic copolymer (A) in a 30 μm square.

The phase area of each phase including the hydrophilic copolymer (A) was measured by setting the threshold with confirming of an image so that an image of the phase including the hydrophilic copolymer (A), obtained by image processing, was matched to a phase image before image processing, by measurement, to create a histogram. The proportion (%) of the sum of the area of a phase having a phase area of 3 μm$^2$ or more and less than 100 μm$^2$ to the total area of the phase including the hydrophilic copolymer (A) was calculated based on the histogram.

(g) Area Matching Ratio C/A

A formed article exposed was cut horizontally to a sheet from the center of the article to provide a small piece, and a cut surface was obtained by a cryo microtome, thereby providing a thin section as a sample for observation. The thin section had a thickness in the range from 200 to 500 μm.

The cross section of the thin section was observed by use of NanoIR 2 spectroscopy manufactured by Anasys Instruments. In the observation, EX-TnIR as a contact probe was used in a cantilever, and a height image as an AFM image was first acquired in an area of 5 μm square. Next, Quantum Cascade Laser as a light source was used, and setting was made as follows: a probe force of 0.3 V, a region of carboxylic acid of 1706 cm$^{-1}$, and a baseline for comparison of 1850 cm$^{-1}$, to perform IR mapping.

Data processing was performed by use of ImageJ. Each data was decomposed with any longitudinal data being designated as "○" and any lateral data being designated as "Δ", and the AFM image and the IR mapping data were allowed to be matched in terms of the number of pixels. Next, each image data was subjected to conversion to 8-bit data, and filtering. Calculation of the median value in the filtering was specified by Radius. After further binarization according to the Otsu's method, a differential image for checking each image was created. The number of pixels matched and the total number of pixels in the differential image were used to determine the rate of matching, namely, the area matching ratio (%).

Examples 2 to 17 and Comparative Example 1

The same manner as in Example 1 was performed except that the type and the amount of the liquid carboxylic acid-modified acrylic polymer as the acidic group-containing polymer (F), and the amount of the elastomer (B) were changed, thereby providing each photosensitive resin composition having a formulation shown in Table 1, and an original plate for flexographic printing and a printing plate, each including the resin composition.

Evaluation results of the resulting photosensitive resin composition, printing original plate, and printing plate are shown in Table 2.

Comparative Examples 2 and 3

After 50 parts by mass of the dried product of the water dispersion liquid of the hydrophilic copolymer (A), obtained in Production Example 2, and 100 parts by mass of a styrene-butadiene-styrene copolymer [D-KX-405: manufactured by Kraton Corporation] were mixed at 130° C. by use of a pressure kneader, a mixture of 110 parts by mass of liquid polybutadiene [LBR-352: manufactured by Kuraray Co., Ltd.], 10 parts by mass of 1,9-nonanediol diacrylate, 10 parts by mass of 1,6-hexanediol dimethacrylate, 5 parts by mass of 2,2-dimethoxyphenylacetophenone, 10 parts by mass of LIR-410 or UC-203, 2 parts by mass of a surfactant: [polyoxyethylene alkyl ether (NT-12): manufactured by Nippon Nyukazai Co., Ltd.], and 5 parts by mass of 2,6-di-t-butyl-p-cresol was added in portions over 15 minutes, and the resultant was further kneaded for 20 minutes after completion of the addition, thereby providing a photosensitive resin composition.

The photosensitive resin composition was used and subjected to the same manner as in Example 1, thereby providing a flexographic printing original plate and a printing plate.

Evaluation results of the resulting photosensitive resin composition, flexographic printing original plate, and printing plate are shown in Table 2.

Comparative Example 4

After 50 parts by mass of the dried product of the water dispersion liquid of the hydrophilic copolymer (A), and 100 parts by mass of a styrene-butadiene-styrene copolymer [D-KX-405: manufactured by Kraton Corporation] were mixed at 130° C. by use of a pressure kneader, a mixture of 130 parts by mass of liquid polybutadiene [LBR-352: manufactured by Kuraray Co., Ltd.], 10 parts by mass of 1,9-nonanediol diacrylate, 10 parts by mass of 1,6-hexanediol dimethacrylate, 5 parts by mass of 2,2-dimethoxyphenylacetophenone, 2 parts by mass of a surfactant: [polyoxyethylene alkyl ether (NT-12): manufactured by Nippon Nyukazai Co., Ltd.], and 5 parts by mass of 2,6-di-t-butyl-p-cresol was added in portions over 15 minutes, and the resultant was further kneaded for 20 minutes after completion of the addition, thereby providing a photosensitive resin composition.

The photosensitive resin composition was used and subjected to the same manner as in Example 1, thereby providing a flexographic printing original plate and a printing plate.

Evaluation results of the resulting photosensitive resin composition, flexographic printing original plate, and printing plate are shown in Table 2.

TABLE 1

|  |  | Example 1 | Example 2 | Example 3 | Example 4 | Example 5 | Example 6 |
|---|---|---|---|---|---|---|---|
| Hydrophilic copolymer A-containing mixture including plasticizers (E) and (F) | Production Example 1 | 150 | 150 | 150 | 150 | 150 | 150 |
| Hydrophilic copolymer A-containing mixture including plasticizer (E) | Production Example 2 |  |  |  |  |  |  |
| Elastomer (B) | D-KX-405 | 100 | 100 | 100 | 100 | 100 | 100 |
| Polymerizable unsaturated monomer (C) | 1,6-Hexanediol dimethacrylate | 10 | 10 | 10 | 10 | 10 | 10 |
|  | 1,9-Nonanediol diacrylate | 10 | 10 | 10 | 10 | 10 | 10 |
| Photo-polymerization Initiator (D) | 2,2-Dimethoxyphenylacetophenone | 5 | 5 | 5 | 5 | 5 | 5 |
| Plasticizer (E) | LBR352 | 120 | 120 | 120 | 120 | 120 | 120 |
| Acidic group-containing polymer (F) or crosslinkable polymer (G) | Grade | CB-3060 | Z250 | UC-3510 | UC-3000 | MAP-2801 | ICB-3098 |
|  | Backbone | Acrylate backbone | Acrylate backbone | Acrylate backbone | Acrylate backbone | Acrylate backbone | Acrylate backbone |
|  | Acid value (mgKOH/g) | 60 | 69 | 70 | 74 | 15 | 98 |
|  | SP value (calculated) | 9 | 9.1 | 9.1 | 9.1 | 9.1 | 9.4 |
|  | Amount added | 100 | 100 | 100 | 100 | 100 | 100 |
|  | % by weight | 26 | 26 | 26 | 2.6 | 26 | 26 |

TABLE 1-continued

|  | Hydrophilic group | Carboxylic acid | Carboxylic acid | Carboxylic acid | Carboxylic acid | Carboxylic acid | Carboxylic acid |
|---|---|---|---|---|---|---|---|
| Surfactant | NT-12 | 2 | 2 | 2 | 2 | 2 | 2 |
| Stabilizer | 2,6-Di-t-butyl-p-cresol | 5 | 5 | 5 | 5 | 5 | 5 |

|  |  | Example 7 | Example 8 | Example 9 | Example 10 | Example 11 |
|---|---|---|---|---|---|---|
| Hydrophilic copolymer A-containing mixture including plasticizers (E) and (F) | Production Example 1 | 150 | 150 | 150 | 200 | 60 |
|  | Production Example 2 |  |  |  |  |  |
| Hydrophilic copolymer A-containing mixture including plasticizer (E) |  |  |  |  |  |  |
| Elastomer (B) | D-KX-405 | 100 | 100 | 100 | 10 | 100 |
| Polymerizable unsaturated monomer (C) | 1,6-Hexanediol dimethacrylate | 10 | 10 | 10 | 10 | 10 |
|  | 1,9-Nonanediol diacrylate | 10 | 10 | 10 | 10 | 10 |
| Photo-polymerization Initiator (D) | 2,2-Dimethoxyphenylacetophenone | 5 | 5 | 5 | 5 | 5 |
| Plasticizer (E) | LBR352 | 120 | 120 | 120 | 120 | 120 |
| Acidic group-containing polymer (F) or crosslinkable polymer (G) | Grade | CBB-3098 | BR-605 | — | CBB-3098 | CBB-3038 |
|  | Backbone | Acrylate backbone | Acrylate backbone | Acrylate backbone | Acrylate backbone | Acrylate backbone |
|  | Acid value (mgKOH/g) | 98 | 228 | 410 | 98 | 98 |
|  | SP value (calculated) | 9.4 | 11.1 | 14 | 9.4 | 9.4 |
|  | Amount added | 100 | 100 | 100 | 150 | 10 |
|  | % by weight | 26 | 26 | 26 | 34 | 3 |
|  | Hydrophilic group | Carboxylic acid | Carboxylic acid | Carboxylic acid | Carboxylic acid | Carboxylic acid |
| Surfactant | NT-12 | 2 | 2 | 2 | 2 | 2 |
| Stabilizer | 2,6-Di-t-butyl-p-cresol | 5 | 5 | 5 | 5 | 5 |

TABLE 2

Continuation of Table 1

|  |  | Example 12 | Example 13 | Example 14 | Example 15 | Example 16 | Example 17 |
|---|---|---|---|---|---|---|---|
| Hydrophilic copolymer A-containing mixture including plasticizers (E) and (F) | Production Example 1 | 55 | 250 | 350 | 150 | 150 | 150 |
|  | Production Example 2 |  |  |  |  |  |  |
| Hydrophilic copolymer A-containing mixture including plasticizer (E) |  |  |  |  |  |  |  |
| Elastomer (B) | D-KX-405 | 100 | 100 | 100 | 75 | 50 | 140 |
| Polymerizable unsaturated monomer (C) | 1,6-Hexanediol dimethacrylate | 10 | 10 | 10 | 10 | 10 | 10 |
|  | 1,9-Nonanediol diactylate | 10 | 10 | 10 | 10 | 10 | 10 |
| Photo-polymerization initiator (D) | 2,2-Dimethoxyphenylacetophenone | 5 | 5 | 5 | 5 | 5 | 5 |
| Plasticizer (E) | LBR352 | 120 | 120 | 120 | 120 | 120 | 120 |
| Acidic group-containing polymer (F) or crosslinkable polymer (G) | Grade | CBB-3098 | CBB-3098 | CBB-3098 | CBB-3098 | CBB-3098 | CBB-3098 |
|  | Backbone | Acrylate backbone | Acrylate backbone | Acrylate backbone | Acrylate backbone | Acrylate backbone | Acrylate backbone |
|  | Acid value (mgKOH/g) | 98 | 98 | 98 | 98 | 98 | 98 |
|  | SP value (calculated) | 9.4 | 9.4 | 9.4 | 9.4 | 9.4 | 9.4 |
|  | Amount added | 5 | 200 | 300 | 100 | 100 | 100 |
|  | % by weight | 2 | 40 | 50 | 27 | 29 | 23 |
|  | Hydrophilic group | Carboxylic acid | Carboxylic acid | Carboxylic acid | Carboxylic acid | Carboxylic acid | Carboxylic acid |
| Surfactant | NT-12 | 2 | 2 | 2 | 2 | 2 | 2 |
| Stabilizer | 2,6-Di-t-butyl-p-cresol | 5 | 5 | 5 | 5 | 5 | 5 |

TABLE 2-continued

Continuation of Table 1

|  |  | Comparative Example 1 | Comparative Example 2 | Comparative Example 3 | Comparative Example 4 |
|---|---|---|---|---|---|
| Hydrophilic copolymer A-containing mixture including plasticizers (E) and (F) | Production Example 1 | 60 | | | |
|  | Production Example 2 | | 50 | 50 | 50 |
| Hydrophilic copolymer A-containing mixture including plasticizer (E) | | | | | |
| Elastomer (B) | D-KX-405 | 100 | 100 | 100 | 100 |
| Polymerizable unsaturated monomer (C) | 1,6-Hexanediol dimethacrylate | 10 | 10 | 10 | 10 |
|  | 1,9-Nonanediol diactylate | 10 | 10 | 10 | 10 |
| Photo-polymerization initiator (D) | 2,2-Dimethoxyphenylacetophenone | 5 | 5 | 5 | 5 |
| Plasticizer (E) | LBR352 | 120 | 120 | 20 | 130 |
| Acidic group-containing polymer (F) or crosslinkable polymer (G) | Grade | LIR-410 | LIR-410 | UC-203 | — |
|  | Backbone | Isoprene backbone | Isoprene backbone | Isoprene backbone | |
|  | Acid value (mgKOH/g) | 6.8 | 6 | 6 | — |
|  | SP value (calculated) | 8.8 | 8.8 | 8.8 | — |
|  | Amount added | 10 | 10 | 10 | — |
|  | % by weight | 3 | 3 | 3 | 0 |
|  | Hydrophilic group | Carboxylic acid | Carboxylic acid | Carboxylic acid | — |
| Surfactant | NT-12 | 2 | 2 | 2 | 2 |
| Stabilizer | 2,6-Di-t-butyl-p-cresol | 5 | 5 | 5 | 5 |

TABLE 3

Table 2

|  | Physical properties and evaluation results | Example 1 | Example 2 | Example 3 | Example 4 | Example 5 | Example 6 |
|---|---|---|---|---|---|---|---|
| (a) | Acid value of photosensitive resin composition | 14 | 15 | 16 | 17 | 2 | 23 |
| (b) | Developability | ● | ● | ● | ● | ● | ● |
|  | (Washing speed) | 9 | 9 | 9 | 9 | 9 | 8 |
| (c) | Printing resistance | ● | ● | ● | ● | ● | ● |
| (d) | Initial haze | ○ | ○ | ○ | ○ | ○ | ○ |
|  | Moisture absorption haze | ○ | ○ | ○ | ○ | ○ | ○ |
| (e) | Water resistance | ○ | ○ | ○ | ○ | ○ | ○ |
| (f) | Proportion of sum of area of phase having phase area of 3 μm² or more and less than 100 μm² (% by area) | 64 | 52 | 71 | 61 | 71 | 68 |
| (g) | Area matching ratio C/A (%) | 82 | 82 | 85 | 84 | 83 | 90 |

|  | Physical properties and evaluation results | Example 7 | Example 8 | Example 9 | Example 10 | Example 11 |
|---|---|---|---|---|---|---|
| (a) | Acid value of photosensitive resin composition | 25 | 50 | 90 | 30 | 2 |
| (b) | Developability | ● | ○ | ● | ● | ○ |
|  | (Washing speed) | 8 | 4 | 3 | 7 | 13 |
| (c) | Printing resistance | ● | ● | ○ | ● | ● |
| (d) | Initial haze | ○ | ○ | Δ | ○ | ○ |
|  | Moisture absorption haze | ○ | ○ | Δ | ○ | ○ |
| (e) | Water resistance | ○ | ○ | ○ | ○ | ○ |
| (f) | Proportion of sum of area of phase having phase area of 3 μm² or more and less than 100 μm² (% by area) | 74 | 65 | 69 | 70 | 55 |
| (g) | Area matching ratio C/A (%) | 92 | 95 | 98 | 93 | 92 |

TABLE 4

Continuation of Table 2

| | Physical properties and evaluation results | Example 12 | Example 13 | Example 14 | Example 15 | Example 16 | Example 17 |
|---|---|---|---|---|---|---|---|
| (a) | Acid value of photosensitive resin composition | 1 | 36 | 45 | 23 | 24 | 20 |
| (b) | Developability | ○ | ● | ● | ● | ● | ○ |
| | (Washing speed) | 14 | 6 | 5 | 6 | 5 | 14 |
| (c) | Printing resistance | ● | ○ | ○ | ● | ○ | ● |
| (d) | Initial haze | ○ | Δ | Δ | ○ | Δ | ○ |
| | Moisture absorption haze | ○ | Δ | Δ | ○ | Δ | ○ |
| (e) | Water resistance | ○ | ○ | ○ | ○ | ○ | ○ |
| (f) | Proportion of sum of area of phase having phase area of 3 μm² or more and less than 100 μm² (% by area) | 52 | 78 | 73 | 64 | 52 | 59 |
| (g) | Area matching ratio C/A (%) | 91 | 91 | 92 | 92 | 95 | 91 |

| | Physical properties and evaluation results | Comparative Example 1 | Comparative Example 2 | Comparative Example 3 | Comparative Example 4 |
|---|---|---|---|---|---|
| (a) | Acid value of photosensitive resin composition | 0.2 | 0.2 | 0.2 | — |
| (b) | Developability | X | X | X | X |
| | (Washing speed) | 25 | 28 | 28 | 30 |
| (c) | Printing resistance | ○ | X | X | X |
| (d) | Initial haze | ○ | Δ | Δ | ○ |
| | Moisture absorption haze | Δ | Δ | Δ | ○ |
| (e) | Water resistance | ○ | Δ | Δ | ○ |
| (f) | Proportion of sum of area of phase having phase area of 3 μm² or more and less than 100 μm² (% by area) | 14 | 16 | 11 | 3 |
| (g) | Area matching ratio C/A (%) | 70 | 52 | 50 | 0 |

In the Tables, each acidic group-containing polymer (F) was obtained from the following.

Z250 (manufactured by Daicel-Allnex Ltd.)
UC-3000 (manufactured by Toagosei Co., Ltd.)
CBB3098 (manufactured by Soken Chemical & Engineering Co., Ltd.)
BR-605 (manufactured by Mitsubishi Rayon Co., Ltd.)
LIR-410 (manufactured by Kuraray Co., Ltd.)

The present application is based on Japanese Patent Application filed on Apr. 4, 2017 (Japanese Patent Application No. 2017-074415), Japanese Patent Application filed on Apr. 4, 2017 (Japanese Patent Application No. 2017-074414), and Japanese Patent Application filed on Apr. 4, 2017 (Japanese Patent Application No. 2017-074417), the contents of which are herein incorporated by reference.

The invention claimed is:

1. A photosensitive resin composition for a flexographic printing plate, the photosensitive resin composition comprising at least:
a hydrophilic copolymer (A);
a thermoplastic elastomer (B);
a photo-polymerizable monomer (C);
a photo-polymerization initiator (D);
a plasticizer (E); and
an acidic group-containing polymer (F) having an acid value of 98 to 400 mKOH/g;
wherein the photosensitive resin composition for the flexographic printing plate has an acid value of 1 to 100 mgKOH/g, as measured by neutralization titration, and
wherein the hydrophilic polymer (A) is an internally crosslinked polymer particle containing at least a hydrophilic carboxyl group-containing unsaturated monomer, a conjugated diene-based monomer, an aromatic vinyl compound, and a monomer unit derived from alkyl (meth)acrylate.

2. The photosensitive resin composition for the flexographic printing plate according to claim 1, wherein when the photosensitive resin composition is formed into a cured product and a cross section of the cured product is observed, C/A is 80 to 98% wherein an area of a region where the hydrophilic copolymer (A) is present is designated as A, an area of a region where an acid component is present, as observed by NanoIR, is designated as B, and an area where A and B are matched is designated as C.

3. The photosensitive resin composition for the flexographic printing plate according to claim 1, wherein the photosensitive resin composition for the flexographic printing plate comprises 1 to 50% by mass of the acidic group-containing polymer (F).

4. The photosensitive resin composition for the flexographic printing plate according to claim 1, wherein the acidic group-containing polymer (F) has an SP value of 9.0 or more and 16.0 or less.

5. The photosensitive resin composition for the flexographic printing plate according to claim 1, wherein the acidic group is at least one selected from the group consisting of a carboxyl group, a sulfonic acid group, a sulfinic acid group, a sulfuric acid group, a phosphoric acid group, a phosphonic acid group, a phosphinic acid group, and a phenol group.

6. The photosensitive resin composition for the flexographic printing plate according to claim 1, wherein the acidic group-containing polymer (F) is a polymer having a poly (meth)acrylic backbone having a weight average molecular weight of 1000 or more.

7. The photosensitive resin composition for the flexographic printing plate according to claim 1, further comprising a crosslinkable polymer (G) containing two or more radically polymerizable, ethylenically unsaturated bond groups.

8. The photosensitive resin composition for the flexographic printing plate according to claim 7, wherein the crosslinkable polymer (G) is a polymer having a number average molecular weight of 1,000 or more and less than 300,000 and having at least one selected from the group consisting of a polyisoprene backbone, a polybutadiene backbone, a hydrogenated polybutadiene backbone, and a poly(meth)acrylate backbone, and the ethylenically unsaturated bond group is (meth)acrylate.

9. The photosensitive resin composition for the flexographic printing plate according to claim 7, wherein the crosslinkable polymer (G) has an acid value of 1 to 400 mgKOH/g.

10. The photosensitive resin composition for the flexographic printing plate according to claim 7, wherein a weight ratio of the hydrophilic copolymer (A) to the crosslinkable polymer (G) is 1% or more and less than 30%.

11. The photosensitive resin composition for the flexographic printing plate according to claim 7, wherein the crosslinkable polymer (G) has an acid structure having an acid value of 1 to 400 mgKOH/g.

12. The photosensitive resin composition for the flexographic printing plate according to claim 1, wherein when the photosensitive resin composition is formed into a cured product and a cross section of the cured product is observed, a proportion of a phase having a phase area of 3 μm$^2$ or more and less than 100 μm$^2$ in a phase comprising the hydrophilic copolymer (A) is 20% by area or more.

13. The photosensitive resin composition for the flexographic printing plate according to claim 1, wherein a content of the elastomer (B) is 50 parts by mass or more and 400 parts by mass or less, a content of the photo-polymerizable monomer (C) is 10 parts by mass or more and 200 parts by mass or less, a content of the photo-polymerization initiator (D) is 0.1 parts by mass or more and 50 parts by mass or less, a content of the plasticizer (E) is 1.0 part by mass or more and 400 parts by mass or less, and a content of the acidic group-containing polymer (F) is 5 parts by mass or more and 800 parts by mass or less, with respect to a total amount of a monomer unit constituting the hydrophilic copolymer (A) of 100 parts by mass.

14. The photosensitive resin composition for the flexographic printing plate according to claim 1, wherein the hydrophilic copolymer (A) comprises 3.0 parts by mass or more and 25 parts by mass or less of a carboxyl group-containing unsaturated monomer unit, 20 parts by mass or more and 60 parts by mass or less of a conjugated diene-based monomer unit, 10 parts by mass or more and 30 parts by mass or less of an aromatic vinyl compound unit, and 25 parts by mass or more and 45 parts by mass or less of an alkyl (meth)acrylate unit, with respect to a total amount of a monomer unit constituting the hydrophilic copolymer (A) of 100 parts by mass.

15. The photosensitive resin composition for the flexographic printing plate according to claim 1, wherein the hydrophilic copolymer (A) has a gel fraction of 80% or more and 99% or less, and the hydrophilic copolymer (A) has a degree of swelling in toluene, of 3.0 or more and 15 or less.

16. The photosensitive resin composition for the flexographic printing plate according to claim 1, wherein the hydrophilic copolymer (A) has a water absorption rate of a film, of 30% or more.

17. The photosensitive resin composition for the flexographic printing plate according to claim 1, wherein the hydrophilic copolymer (A) is an internally crosslinked polymer particle comprising a unit derived from an unsaturated double bond-containing reactive emulsifier.

18. A method for producing the photosensitive resin composition for the flexographic printing plate according to claim 1, the method comprising the following in the listed order:

1: adding the acidic group-containing polymer (F) and/or the crosslinkable polymer (G), and the plasticizer (E) to a water dispersion liquid comprising the hydrophilic copolymer (A), 2: removing water from the water dispersion liquid comprising the hydrophilic copolymer (A), obtained in part 1, to obtain a mixture comprising the hydrophilic copolymer (A), and 3: adding the elastomer (B), the polymerizable unsaturated monomer (C), the photo-polymerization initiator (D), and the plasticizer (E) to the mixture to obtain a second mixture, and kneading the second mixture.

19. A flexographic printing original plate comprising a support, and a photosensitive resin layer stacked on the support, wherein the photosensitive resin layer comprises the photosensitive resin composition for the flexographic printing plate according to claim 1.

20. A flexographic printing plate produced from the flexographic printing original plate according to claim 19, wherein the flexographic printing plate has an amount of abrasion of 10 mg/cm$^2$ or less in an abrasion resistance test of a solid portion with a Taber abrasion tester run 1000 times after immersion in a 10% IPA solution for 24 hours, and an amount of abrasion of 20 mg or less in an abrasion resistance test of a rhombic pattern with a Taber abrasion tester run 2000 times.

\* \* \* \* \*